(12) United States Patent
Tanaka et al.

(10) Patent No.: US 9,653,564 B2
(45) Date of Patent: May 16, 2017

(54) SEMICONDUCTOR DEVICE AND METHOD OF MANUFACTURING THE SAME

(71) Applicant: TOYODA GOSEI CO., LTD., Kiyosu-shi (JP)

(72) Inventors: Nariaki Tanaka, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/063,274

(22) Filed: Mar. 7, 2016

(65) Prior Publication Data
US 2016/0284812 A1   Sep. 29, 2016

(30) Foreign Application Priority Data
Mar. 26, 2015 (JP) ................... 2015-064093

(51) Int. Cl.
| | |
|---|---|
| *H01L 29/45* | (2006.01) |
| *H01L 21/283* | (2006.01) |
| *H01L 21/311* | (2006.01) |
| *H01L 21/285* | (2006.01) |
| *H01L 29/47* | (2006.01) |
| *H01L 29/872* | (2006.01) |
| *H01L 29/20* | (2006.01) |

(52) U.S. Cl.
CPC ......... *H01L 29/452* (2013.01); *H01L 21/283* (2013.01); *H01L 21/28575* (2013.01); *H01L 21/28581* (2013.01); *H01L 21/31122* (2013.01); *H01L 29/2003* (2013.01); *H01L 29/475* (2013.01); *H01L 29/872* (2013.01)

(58) Field of Classification Search
CPC ............................ H01L 29/452; H01L 21/283
USPC ............................ 438/238, 239; 257/13, 296
See application file for complete search history.

(56) References Cited

U.S. PATENT DOCUMENTS

| | | | |
|---|---|---|---|
| 4,551,908 A * | 11/1985 | Nagasawa | ......... H01L 21/28518 257/E21.165 |
| 5,563,422 A | 10/1996 | Nakamura et al. | |
| 6,433,842 B1 | 8/2002 | Kaneko et al. | |
| 2001/0050386 A1 | 12/2001 | Suzuki et al. | |
| 2004/0142546 A1* | 7/2004 | Kudo | .............. H01L 21/823835 438/585 |
| 2013/0277670 A1* | 10/2013 | Isobe | ................... H01L 29/7869 257/43 |

FOREIGN PATENT DOCUMENTS

| | | |
|---|---|---|
| JP | H 07-221103 A | 8/1995 |
| JP | 2001-166336 A | 6/2001 |

(Continued)

*Primary Examiner* — Dung Le
(74) *Attorney, Agent, or Firm* — McGinn IP Law Group, PLLC

(57) ABSTRACT

There is provided a method of manufacturing a semiconductor device. The method of manufacturing comprises a film formation process of forming a molybdenum layer that is mainly made of molybdenum (Mo), on at least one of a semiconductor layer, an insulating film and an electrode in the semiconductor device; a heat treatment process of heating the molybdenum layer at temperature of not lower than 200° C.; and a dry etching process of processing the semiconductor device that includes the formed molybdenum layer by dry etching, subsequent to the heat treatment process.

10 Claims, 16 Drawing Sheets

(56) References Cited

FOREIGN PATENT DOCUMENTS

| | | | |
|---|---|---|---|
| JP | 2001-244436 | A | 9/2001 |
| JP | 2011-238866 | A | 11/2011 |
| JP | 2014-143291 | A | 8/2014 |

\* cited by examiner

SEMICONDUCTOR DEVICE AND METHOD OF MANUFACTURING THE SAME

CROSS-REFERENCE TO RELATED APPLICATIONS

The present application claims priority from Japanese patent application No.2015-064093 filed on Mar. 26, 2015, the content of which is hereby incorporated by reference into this application.

BACKGROUND

Technical Field

The present invention relates to a semiconductor device and a method of manufacturing the same.

Related Art

In the process of manufacturing a semiconductor device (semiconductor element), an electrode formed in the semiconductor device is likely to be exposed to dry etching. When the electrode has insufficient resistance to dry etching, the electrode exposed to dry etching is damaged. The damaged electrode fails to have desired electrical properties and may even disappear from the semiconductor device.

JP 2011-238866A discloses a technique of forming an outermost layer of an electrode from a noble metal such as gold (Au) or platinum (Pt), with a view to enhancing the resistance of the electrode to dry etching.

JP 2001-166336A discloses a technique of forming an outermost layer of an electrode from a molybdenum chromium alloy (MoCr), with a view to enhancing the resistance of the electrode to dry etching.

JP 2001-244436A discloses a technique of forming an outermost layer of an electrode from a metal nitride such as tungsten nitride (WN) or tantalum nitride (TaN), with a view to enhancing the resistance of the electrode to dry etching.

The technique disclosed in JP 2011-238866A uses the noble metal and accordingly has a problem of increasing the manufacturing cost. The technique disclosed in JP 2001-166336A has a difficulty in forming a layer using an alloy with high accuracy and accordingly has a problem of increasing the manufacturing cost. The technique disclosed in JP 2001-244436A has a difficulty in forming a layer using a metal nitride with high accuracy and accordingly has a problem of increasing the manufacturing cost.

There is accordingly a need for a technique that readily forms a metal layer having sufficient resistance to dry etching. Other needs with regard to the semiconductor device include cost reduction, miniaturization, easy manufacture, resource saving, improvement of usability and improvement of durability.

SUMMARY

In order to solve at least part of the problems described above, the invention may be implemented by aspects described below.

(1) According to one aspect of the invention, there is provided a method of manufacturing a semiconductor device. The method of manufacturing comprises: a film formation process of forming a molybdenum layer that is mainly made of molybdenum (Mo), on at least one of a semiconductor layer, an insulating film and an electrode in the semiconductor device; a heat treatment process of heating the molybdenum layer at temperature of not lower than 200° C.; and a dry etching process of processing the semiconductor device that includes the formed molybdenum layer by dry etching, subsequent to the heat treatment process. This configuration readily provides the molybdenum layer as a metal layer having sufficient resistance to dry etching. This results in reducing the manufacturing cost of the semiconductor device.

(2) In the method of manufacturing the semiconductor device of the above aspect, the heat treatment process may heat the molybdenum layer that is placed in an atmosphere mainly made of at least one of nitrogen, argon and oxygen or is placed in vacuum at temperature of not lower than 200° C. This configuration provides the molybdenum layer with the sufficient resistance to dry etching.

(3) In the method of manufacturing the semiconductor device of the above aspect, the heat treatment process may heat the molybdenum layer at temperature of not lower than 200° C. for a time period between 1 minute and 10 minutes, inclusive. This configuration provides the molybdenum layer with the sufficient resistance to dry etching.

(4) In the method of manufacturing the semiconductor device of the above aspect, the dry etching process may process the semiconductor device that includes the exposed molybdenum layer by dry etching using a chlorine-containing gas, subsequent to the heat treatment process. This configuration readily provides the molybdenum layer as a metal layer having sufficient resistance to chlorine-based dry etching.

(5) The method of manufacturing the semiconductor device of the above aspect may further comprise a process of heating the electrode, prior to the film formation process. This configuration enables the electrical properties of the electrode to be more readily adjusted, compared with a configuration of heating the electrode after the film formation process.

(6) In the method of manufacturing the semiconductor device of the above aspect, the film formation process may form the molybdenum layer on the electrode, and the heat treatment process may heat the molybdenum layer at temperature between 200° C. and 450° C., inclusive. This configuration protects the electrode located below the molybdenum layer from damage by dry etching.

(7) In the method of manufacturing the semiconductor device of the above aspect, the heat treatment process may heat the molybdenum layer at temperature of not lower than 700° C. This configuration further enhances the resistance of the molybdenum layer to dry etching.

(8) In the method of manufacturing the semiconductor device of the above aspect, the dry etching process may process the semiconductor device that includes at least one of the semiconductor layer and the insulating film exposed and the exposed molybdenum layer by dry etching, subsequent to the heat treatment process. This configuration protects the semiconductor layer and the insulating film located below the molybdenum layer from damage by dry etching.

(9) In the method of manufacturing the semiconductor device of the above aspect, the molybdenum layer may be formed as part of the electrode. This configuration enhances the resistance of the electrode to dry etching.

(10) The method of manufacturing the semiconductor device of the above aspect may further comprise a process of forming the semiconductor layer that is mainly made of gallium nitride (GaN). This configuration reduces the manufacturing cost of a gallium nitride-based semiconductor device.

The invention may be implemented by any of various aspects other than the method of manufacturing the semiconductor device described above, for example, a semiconductor device manufactured by the method of manufacturing the semiconductor device according to any of the above aspects, a power converter including the semiconductor device and a manufacturing apparatus that implements the method of manufacturing the semiconductor device according to any of the above aspects.

The above aspects of the invention provide the molybdenum layer as the metal layer having sufficient resistance to dry etching. This results in reducing the manufacturing cost of the semiconductor device.

BRIEF DESCRIPTION OF DRAWINGS

The invention will be described with reference to the accompanying drawings in which:

FIG. 15 is a graph showing the results of evaluation on the contact resistance of each electrode which a molybdenum layer is stacked on;

FIG. 16 is a graph showing the results of evaluation on the contact resistance of each electrode which a molybdenum layer is stacked on;

DESCRIPTION OF EMBODIMENTS

A. First Embodiment

A-1. Configuration of Semiconductor Device

Figure 1:
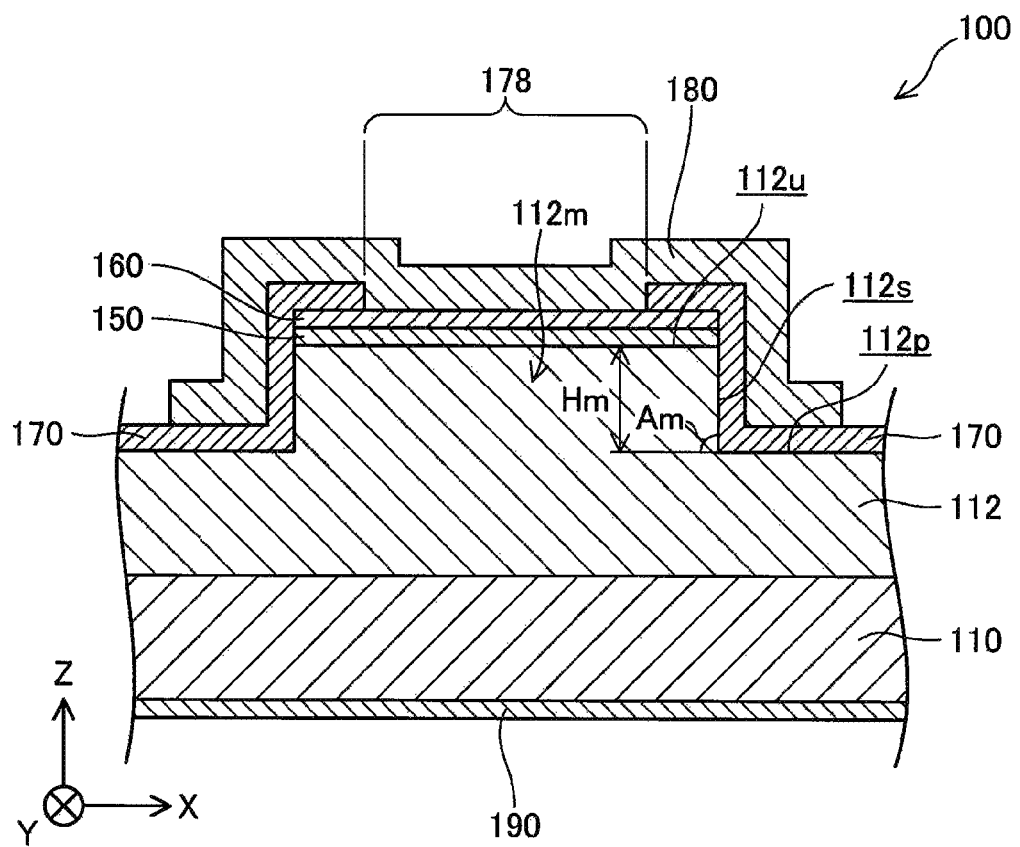
FIG. 1 is a sectional view schematically illustrating the configuration of a semiconductor device according to a first embodiment.

FIG. 1 is a sectional view schematically illustrating the configuration of a semiconductor device 100 according to a first embodiment. XYZ axes orthogonal to one another are illustrated in FIG. 1. Among the XYZ axes of FIG. 1, the X axis denotes a left-right axis on the sheet surface of FIG. 1. +X-axis direction denotes a rightward direction on the sheet surface, and −X-axis direction denotes a leftward direction on the sheet surface. Among the XYZ axes of FIG. 1, the Y axis denotes a front-back axis on the sheet surface of FIG. 1. +Y-axis direction denotes a backward direction on the sheet surface, and −Y-axis direction denotes a forward direction on the sheet surface. Among the XYZ axes of FIG. 1, the Z axis denotes a top-bottom axis on the sheet surface of FIG. 1. +Z-axis direction denotes an upward direction on the sheet surface, and −Z-axis direction denotes a downward direction on the sheet surface. The XYZ axes illustrated in other drawings correspond to the XYZ axes of FIG. 1.

The semiconductor device 100 is a GaN-based semiconductor device formed using gallium nitride (GaN). According to this embodiment, the semiconductor device 100 is a vertical Schottky barrier diode. According to this embodiment, the semiconductor device 100 is used for power control and is also called power device. The semiconductor device 100 includes a substrate 110, a semiconductor layer 112, a Schottky electrode 150, a molybdenum layer 160, an insulating film 170, a wiring electrode 180 and a rear face electrode 190.

The substrate 110 of the semiconductor device 100 is a plate-like semiconductor extended along the X axis and the Y axis. According to this embodiment, the substrate 110 is mainly made of gallium nitride (GaN). In the description hereof, the expression of "mainly made of gallium nitride (GaN)" means "containing gallium nitride (GaN) at 90% or a higher molar fraction. According to this embodiment, the substrate 110 is an n-type semiconductor containing silicon (Si) as the donor element. According to this embodiment, the average concentration of silicon (Si) contained in the substrate 110 is about $1 \times 10^{18}$ cm$^{-3}$.

The semiconductor layer 112 of the semiconductor device 100 is an n-type semiconductor layer that is located on the +Z-axis direction side of the substrate 110 and is extended along the X axis and the Y axis. According to this embodiment, the semiconductor layer 112 is mainly made of gallium nitride (GaN). According to this embodiment, the semiconductor layer 112 contains silicon (Si) as the donor element. According to this embodiment, the average concentration of silicon (Si) contained in the semiconductor layer 112 is about $1\times10^{16}$ cm$^{-3}$. According to this embodiment, the semiconductor layer 112 is a semiconductor layer formed by metal organic chemical vapor deposition (MOCVD).

The semiconductor layer 112 includes a mesa structure 112m and a peripheral surface 112p. The mesa structure 112m of the semiconductor layer 112 is formed in a shape of plateau having an upper face 112u and a side face 112s. According to this embodiment, the mesa structure 112m is a structure protruded in the +Z-axis direction from the peripheral surface 112p. The peripheral surface 112p of the semiconductor layer 112 is a surface extended around the mesa structure 112m. According to this embodiment, the mesa structure 112m and the peripheral surface 112p are structures formed by dry etching. According to this embodiment, the thickness (Z-axis direction length) of the semiconductor layer 112 is about 10 μm (micrometers) at the location of the mesa structure 112m.

In terms of reducing potential crowding at an end of the Schottky electrode 150, the mesa structure 112m preferably has a height Hm that is greater than the thickness of the insulating film 170. In terms of ensuring the workability, the height Hm of the mesa structure 112m is preferably not greater than 5 μm. In terms of reducing potential crowding at the end of the Schottky electrode 150, the side face 112s preferably has an angle Am relative to the peripheral surface 112p in a range between 10 degrees and 90 degrees, inclusive.

The Schottky electrode 150 of the semiconductor device 100 is an anode electrode that is made of a conductive material and forms a Schottky junction with the upper face 112u of the semiconductor layer 112. In terms of reducing potential crowding at the end of the Schottky electrode 150, distance between the end of the Schottky electrode 150 and the end of the upper face 112u is preferably not greater than 2 μm.

According to this embodiment, the Schottky electrode 150 is mainly made of nickel (Ni). According to this embodiment, the thickness (Z-axis direction length) of the Schottky electrode 150 is about 100 nm (nanometers). According to this embodiment, the Schottky electrode 150 is a metal layer formed by electron beam deposition.

The molybdenum layer 160 of the semiconductor device 100 is a metal layer that is mainly made of molybdenum (Mo) and is processed by heat treatment at temperature of not lower than 200° C. According to this embodiment, the molybdenum layer 160 is formed on the Schottky electrode 150. According to this embodiment, the molybdenum layer 160 is a metal layer formed by electron beam deposition. According to this embodiment, the molybdenum layer 160 is a metal layer processed by heat treatment at temperature of 400° C.

The insulating film 170 of the semiconductor device 100 is a film having electrical insulating properties and is formed to be extended from the peripheral surface 112p across the side face 112s onto the molybdenum layer 160. According to this embodiment, the insulating film 170 is a film obtained by stacking a layer of about 500 nm in thickness that is mainly made of silicon dioxide ($SiO_2$) and is formed by plasma chemical vapor deposition (plasma CVD) on a layer of about 100 nm in thickness that is mainly made of aluminum oxide ($Al_2O_3$) and is formed by atomic layer deposition (ALD).

The insulating film 170 has a contact hole 178 formed on the molybdenum layer 160. The contact hole 178 is an opening which the molybdenum layer 160 is exposed on. The contact hole 178 has a structure obtained by removing part of the insulating film 170 by hydrofluoric acid-based wet etching to expose the molybdenum layer 160.

The wiring electrode 180 of the semiconductor device 100 is an anode electrode that is made of a conductive material and is electrically connected with the Schottky electrode 150 via the molybdenum layer 160 inside of the contact hole 178. The wiring electrode 180 is formed to be extended from inside of the contact hole 178 across an area of the insulating film 170 formed on the side face 112s to an area of the insulating film 170 formed on the peripheral surface 112p. This provides the field plate structure in which the insulating film 170 is placed between the wiring electrode 180 and the semiconductor layer 112.

According to this embodiment, the wiring electrode 180 is an electrode obtained by stacking a layer of about 20 nm in thickness that is mainly made of titanium (Ti), a layer of about 200 nm in thickness that is mainly made of titanium nitride (TiN), a layer of about 20 nm in thickness that is mainly made of titanium (Ti) and a layer of about 2000 nm in thickness that is mainly made of an aluminum-silicon alloy (AlSi) sequentially from the side of the Schottky electrode 150 and the insulating film 170 by sputtering.

The rear face electrode 190 of the semiconductor device 100 is a cathode electrode that is made of a conductive material and is in ohmic contact with the −Z-axis direction side of the substrate 110. According to this embodiment, the rear face electrode 190 is an electrode obtained by stacking a layer mainly made of an aluminum-silicon alloy (AlSi) on a layer mainly made of titanium (Ti) by sputtering.

A-2. Method of Manufacturing Semiconductor Device

Figure 2:
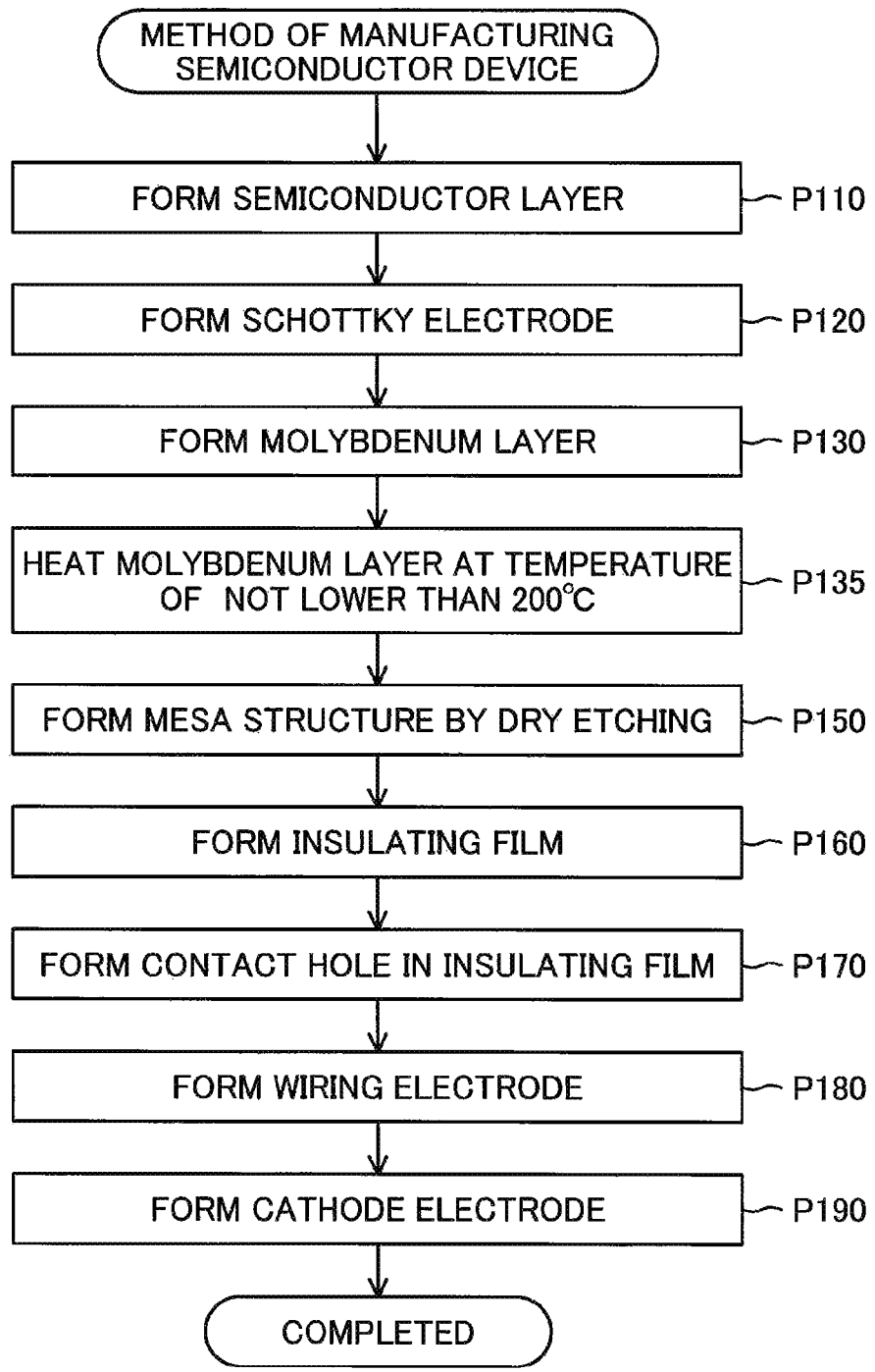
FIG. 2 is a process chart showing a method of manufacturing the semiconductor device according to the first embodiment.

FIG. 2 is a process chart showing a method of manufacturing the semiconductor device 100 according to the first embodiment. FIGS. 3 to 6 are diagrams illustrating the processes of manufacturing the semiconductor device 100.

Figure 3:
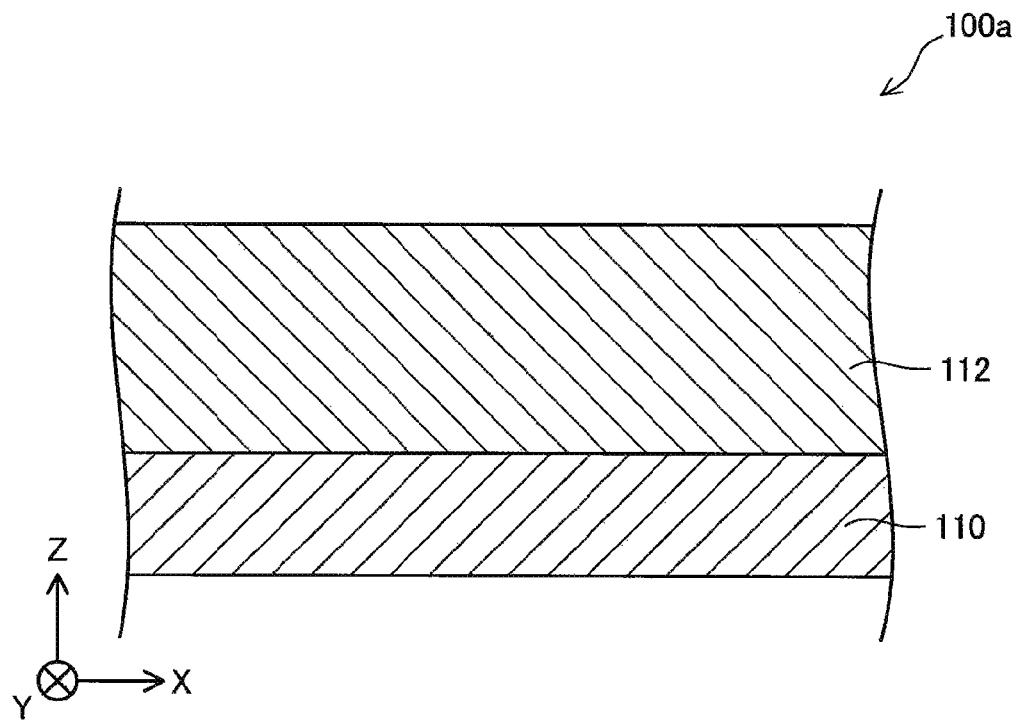
FIG. 3 is a diagram illustrating a process of manufacturing the semiconductor device.

The manufacturer of the semiconductor device 100 first forms the semiconductor layer 112 on the substrate 110 by epitaxial growth (process P110, FIG. 3). The manufacturer accordingly obtains a semiconductor device 100a with the semiconductor layer 112 formed on the substrate 110 as an intermediate product of the semiconductor device 100. According to this embodiment, the manufacturer employs metal organic chemical vapor deposition (MOCVD) to form the semiconductor layer 112.

Figure 4:
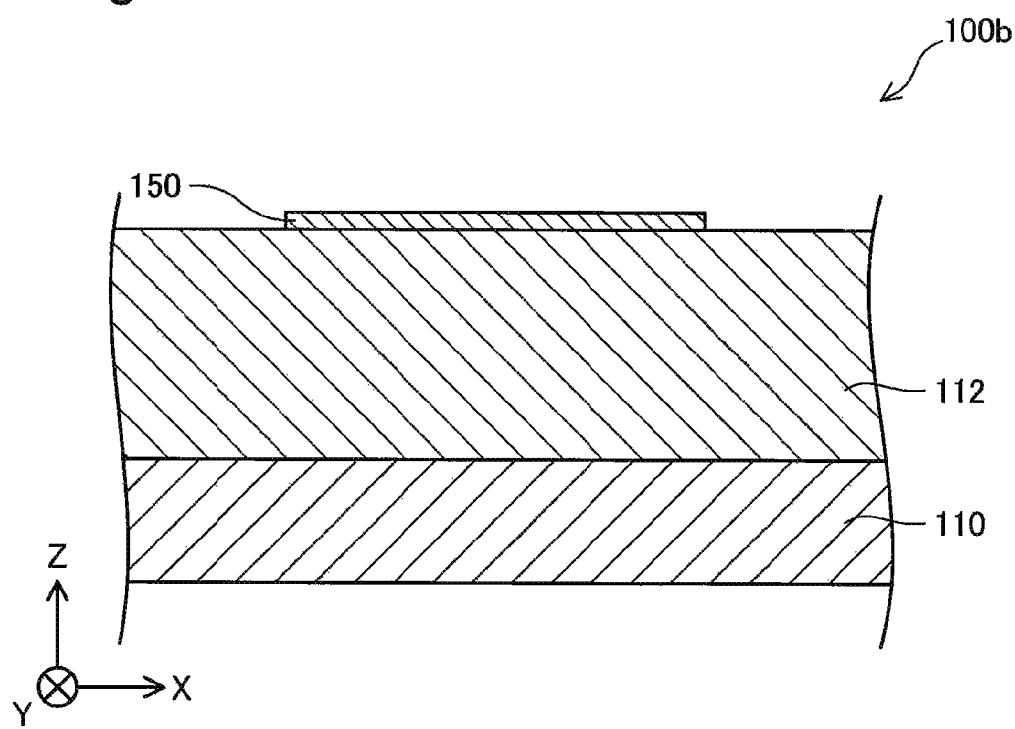
FIG. 4 is a diagram illustrating a process of manufacturing the semiconductor device.

After forming the semiconductor layer 112 (process P110), the manufacturer forms the Schottky electrode 150 on the semiconductor layer 112 (process P120, FIG. 4). The manufacturer accordingly obtains a semiconductor device 110b with the Schottky electrode 150 formed on the semiconductor layer 112 as an intermediate product of the semiconductor device 100.

According to this embodiment, the manufacturer forms the Schottky electrode 150 by electron beam deposition using the lift-off method. The method employable to form the Schottky electrode 150 is, however, not limited to electron beam deposition but may be resistive heating vapor deposition or sputtering. According to another embodiment, the manufacturer may form a metal layer over the whole surface of the semiconductor layer 112 and subsequently remove part of the metal layer to form the Schottky electrode 150. According to this embodiment, the manufacturer forms a layer of about 100 nm in thickness that is mainly made of nickel (Ni) on the semiconductor layer 112 to form the Schottky electrode 150.

Figure 5:
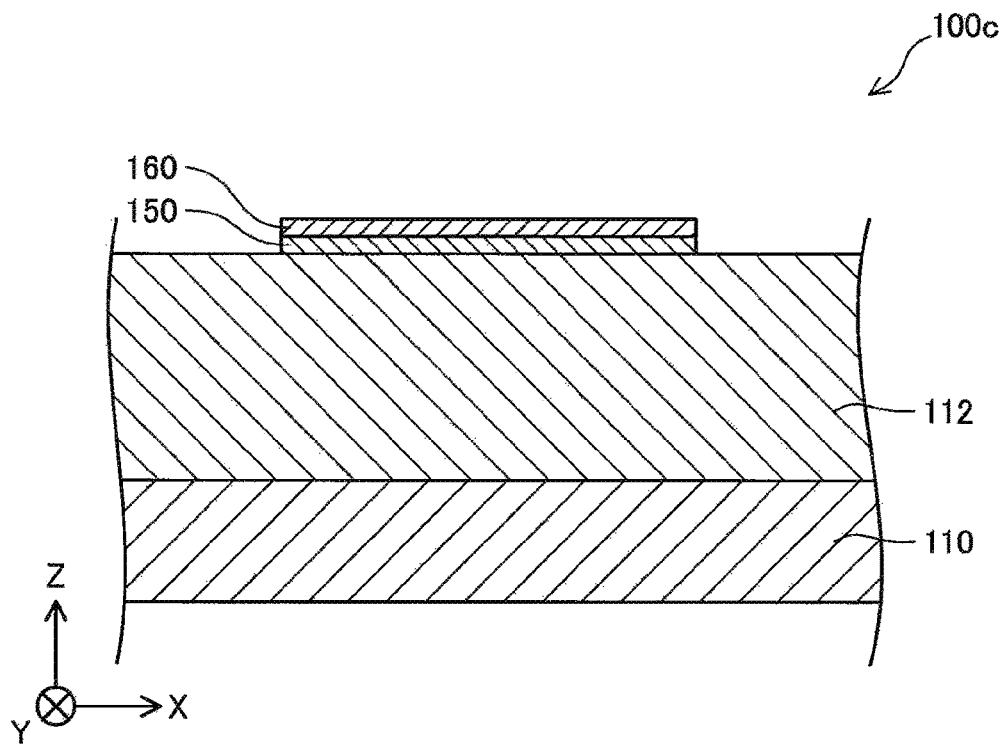
FIG. 5 is a diagram illustrating a process of manufacturing the semiconductor device.

After forming the Schottky electrode 150 (process P120), the manufacturer forms the molybdenum layer 160 on the Schottky electrode 150 (process P130, FIG. 5). The manufacturer accordingly obtains a semiconductor device 100c with the molybdenum layer 160 formed on the Schottky electrode 150 as an intermediate product of the semiconductor device 100.

According to this embodiment, the manufacturer forms the molybdenum layer 160 by electron beam deposition using the lift-off method. The method employable to form the molybdenum layer 160 is, however, not limited to electron beam deposition but may be resistive heating vapor deposition or sputtering. According to another embodiment, the manufacturer may form a metal layer over the entire surface of the Schottky electrode 115 and the semiconductor layer 112 and subsequently remove part of the metal layer to form the molybdenum layer 160. According to this embodiment, the manufacturer forms a layer of about 300 nm in thickness that is mainly made of molybdenum (Mo) on the Schottky electrode 150 to form the molybdenum layer 160. The molybdenum layer 160 is required to have a sufficient thickness for protecting the Schottky electrode 150 in a downstream process of forming the mesa structure 112m by dry etching.

After forming the molybdenum layer 160 (process P130), the manufacturer heats the molybdenum layer 160 at temperature of 200° C. or higher temperature (process P135). This process enhances the resistance of the molybdenum layer 160 to dry etching. The temperature of heating the molybdenum layer 160 (heat treatment temperature) is required to be not lower than 200° C. in a range that does not deteriorate the Schottky characteristics of the Schottky electrode 150. According to this embodiment, the heat treatment temperature is 400° C.

According to this embodiment, the manufacturer heats the molybdenum layer 160 in an atmosphere mainly made of nitrogen ($N_2$). According to another embodiment, the manufacturer may heat the molybdenum layer 160 in an atmosphere mainly made of at least one of argon (Ar) and oxygen ($O_2$) or may heat the molybdenum layer 160 in vacuum. The time of heating the molybdenum layer 160 (heating time) is required to be between 1 minute and 10 minutes, inclusive. According to this embodiment, the heating time is 5 minutes.

Figure 6:
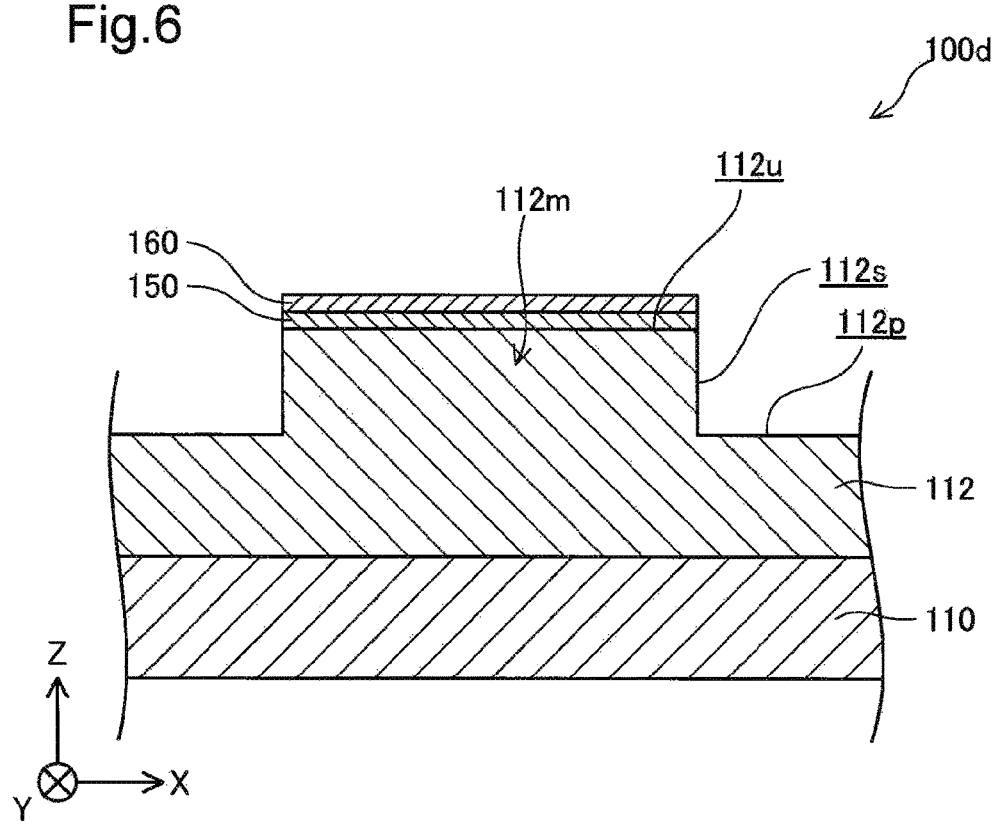
FIG. 6 is a diagram illustrating a process of manufacturing the semiconductor device.

After heating the molybdenum layer 160 (process P135), the manufacturer forms the mesa structure 112m by dry etching of the semiconductor device 100c including the molybdenum layer 160 (process P150, FIG. 6). The manufacturer accordingly obtains a semiconductor device 100d in which the mesa structure 112m is formed as an intermediate product of the semiconductor device 100.

According to this embodiment, the manufacturer uses a mixed gas mainly made of chlorine ($Cl_2$), boron chloride ($BCl_3$) and nitrogen ($N_2$) to form the mesa structure 112m by inductively-coupled plasma (ICP) dry etching. In the process of dry etching to form the mesa structure 112m (process P150), the molybdenum layer 160 serves as a protective film to protect the Schottky electrode 150 from dry etching and also serves as a mask pattern to form the mesa structure 112m. According to this embodiment, the molybdenum layer 160 is left on the Schottky electrode 150 even after dry etching. According to another embodiment, at least part of the molybdenum layer 160 may disappear from top of the Schottky electrode 150 by dry etching.

After forming the mesa structure 112m by dry etching (process P150), the manufacturer forms the insulating film 170 that is extended from the peripheral surface 112p across the side face 112s onto the molybdenum layer 160 (process P160). According to this embodiment, the manufacturer forms a layer mainly made of aluminum oxide ($Al_2O_3$) by atomic layer deposition (ALD) and subsequently stacks a layer mainly made of silicon dioxide ($SiO_2$) by plasma chemical vapor deposition (plasma CVD) to form the insulating film 170.

After forming the insulating film 170 (process P160), the manufacturer forms the contact hole 178 in the insulating film 170 to expose the Schottky electrode 150 (process P170). According to this embodiment, the manufacturer forms a mask pattern on an area of the surface of the insulating film 170 other than an area that is to be removed as the contact hole 178 and subsequently removes part of the insulating film 170 by hydrofluoric acid-based wet etching to form the contact hole 178 in the insulating film 170. The manufacturer then removes the mask pattern left on the insulating film 170.

After forming the contact hole 178 in the insulating film 170 (process P170), the manufacturer forms the wiring electrode 180 (process P180). According to this embodiment, the manufacturer forms a metal layer as the base of the wiring electrode 180 over the entire surface of the molybdenum layer 160 and the insulating film 170 by sputtering. The manufacturer subsequently forms a mask pattern (photoresist) in an area that is to be left as the wiring electrode 180 and removes part of the metal layer by chlorine (Cl)-based dry etching to form the wiring electrode 180. The manufacturer then removes the mask pattern left on the wiring electrode 180.

After forming the wiring electrode 180 (process P180), the manufacturer forms the rear face electrode 190 (process P190). According to this embodiment, the manufacturer stacks a layer mainly made of an aluminum-silicon alloy (AlSi) on a layer mainly made of titanium (Ti) by sputtering to form the rear face electrode 190.

The semiconductor device 100 is completed by the above series of processes. According to another embodiment, as long as the semiconductor layer 112 has been formed in advance (process P110), the manufacturer may form the rear face electrode 190 (process P190) before forming the wiring electrode 180 (process P180).

A-3. Evaluation Test

Figure 7:
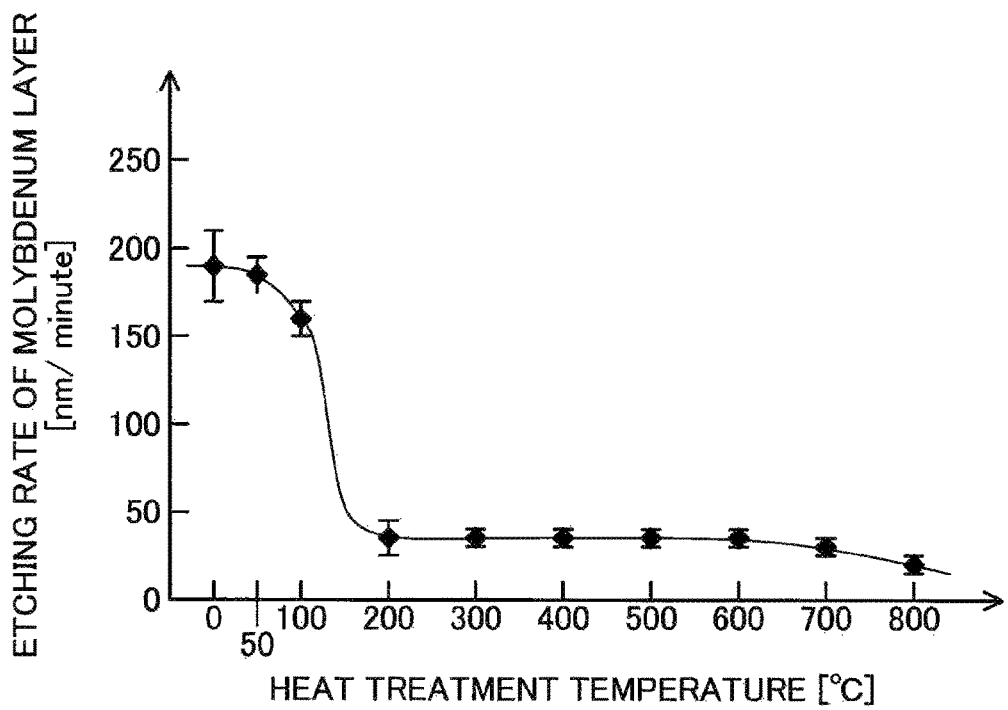
FIG. 7 is a graph showing the results of evaluation on the relationship between the etching rate and the heat treatment temperature of the molybdenum layer.

FIG. 7 is a graph showing the results of evaluation on the relationship between the etching rate and the heat treatment temperature of the molybdenum layer. In the evaluation test of FIG. 7, the examiner prepared a plurality of samples by forming a molybdenum layer of about 500 nm in thickness mainly made of molybdenum (Mo) on a substrate mainly made of silicon (Si). The examiner subsequently processed samples among the plurality of samples respectively by heat treatment at a plurality of different temperatures. The heat treatment temperatures set in heat treatment of these samples were 50° C., 100° C., 200° C., 300° C., 400° C., 500° C., 600° C., 700° C. and 800° C. The examiner heated each sample placed in an atmosphere mainly made of nitrogen at one of the heat treatment temperatures for 5 minutes.

After providing the samples without heat treatment and the samples with heat treatment at the respective heat treatment temperatures, the examiner formed a photoresist mask on each of the samples to expose part of the molybdenum layer. The examiner subsequently processed the molybdenum layer exposed on the photoresist mask in each sample by inductively-coupled plasma (ICP) dry etching using a mixed gas mainly made of chlorine ($Cl_2$), boron chloride ($BCl_3$) and nitrogen ($N_2$) for 1 minute. The conditions of dry etching for the molybdenum layer of each sample were set to provide the etching rate of 800 to 1000 nm/minute with regard to aluminum (Al) and the aluminum silicon alloy (AlSi, containing 90% or a higher ratio of Al)

and to provide the etching rate of 180 nm/minute with regard to titanium (Ti) and titanium nitride (TiN).

After processing each of the samples by dry etching, the examiner removed the photoresist mask left on each sample. The examiner subsequently measured a step formed in the molybdenum layer of each sample by dry etching. The examiner then computed the etching rate of the molybdenum layer in each sample to obtain the results shown in FIG. 7. Data at the heat treatment temperature of 0° C. in FIG. 7 shows the values with regard to the molybdenum layers of the samples without heat treatment.

As shown in FIG. 7, the etching rate of the molybdenum layer is 150 nm/minute or higher at the heat treatment temperature of not higher than 100° C., and is decreased to or below 40 nm/minute at the heat treatment temperature of not lower than 200° C. The etching rate of the molybdenum layer is in a range of 30 to 40 nm/minute at the heat treatment temperature between 200° C. and 600° C. inclusive, is decreased to 20 to 30 nm/minute at the heat treatment temperature of 700° C. and is further decreased to 10 to 20 nm/minute at the heat treatment temperature of 800° C. These results show that heating the sample at temperature of not lower than 200° C. sufficiently enhances the dry etch resistance of the molybdenum layer. In terms of enhancing the dry etch resistance of the molybdenum layer, the heat treatment temperature is preferably not lower than 200° C., is more preferably not lower than 700° C. and is furthermore preferably not lower than 800° C.

Figure 8:
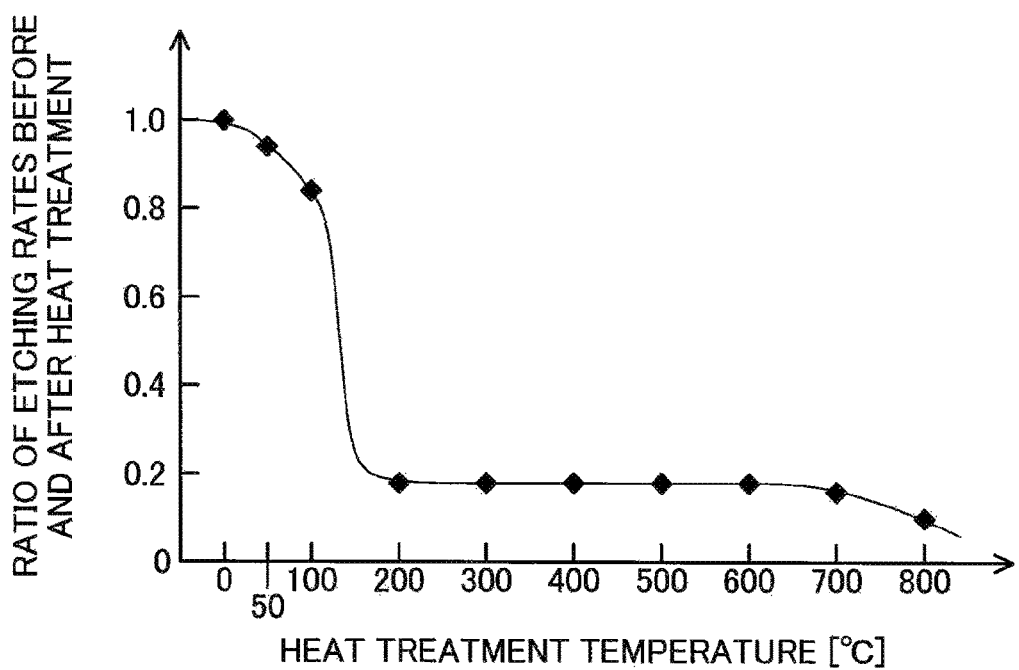
FIG. 8 is a graph showing the relationship between the ratio of etching rates before and after heat treatment and the heat treatment temperature of the molybdenum layer the ratio of etching rates before and after heat treatment.

FIG. 8 is a graph showing the relationship between the ratio of etching rates before and after heat treatment and the heat treatment temperature of the molybdenum layer. The ratio of etching rates before and after heat treatment is based on the results of the evaluation test of FIG. 7 and denotes a ratio of the etching rate after heat treatment at each heat treatment temperature to the etching rate before heat treatment. As shown in FIG. 8, the etching rate of the molybdenum layer by dry etching after heat treatment of the molybdenum layer at temperature of not lower than 200° C. is not greater than about 0.20 times the etching rate of the molybdenum layer without heat treatment. The etching rate of the molybdenum layer by dry etching after heat treatment of the molybdenum layer at temperature of not lower than 700° C. is about 0.15 times the etching rate of the molybdenum layer without heat treatment. The etching rate of the molybdenum layer by dry etching after heat treatment of the molybdenum layer at temperature of not lower than 800° C. is about 0.10 times the etching rate of the molybdenum layer without heat treatment.

A-4. Advantageous Effects

According to the first embodiment described above, the molybdenum layer 160 is heated at temperature of not lower than 200° C. This readily provides the molybdenum layer 160 as the metal layer having sufficient resistance to dry etching. This results in reducing the manufacturing cost of the semiconductor device 100.

The molybdenum layer 160 protects the Schottky electrode 150 located below the molybdenum layer 160 from damage by dry etching. When the molybdenum layer 160 is regarded as part of the Schottky electrode 150, the molybdenum layer 160 enhances the resistance of the Schottky electrode 150 to dry etching.

B. Second Embodiment

B-1. Configuration of Semiconductor Device

Figure 9:
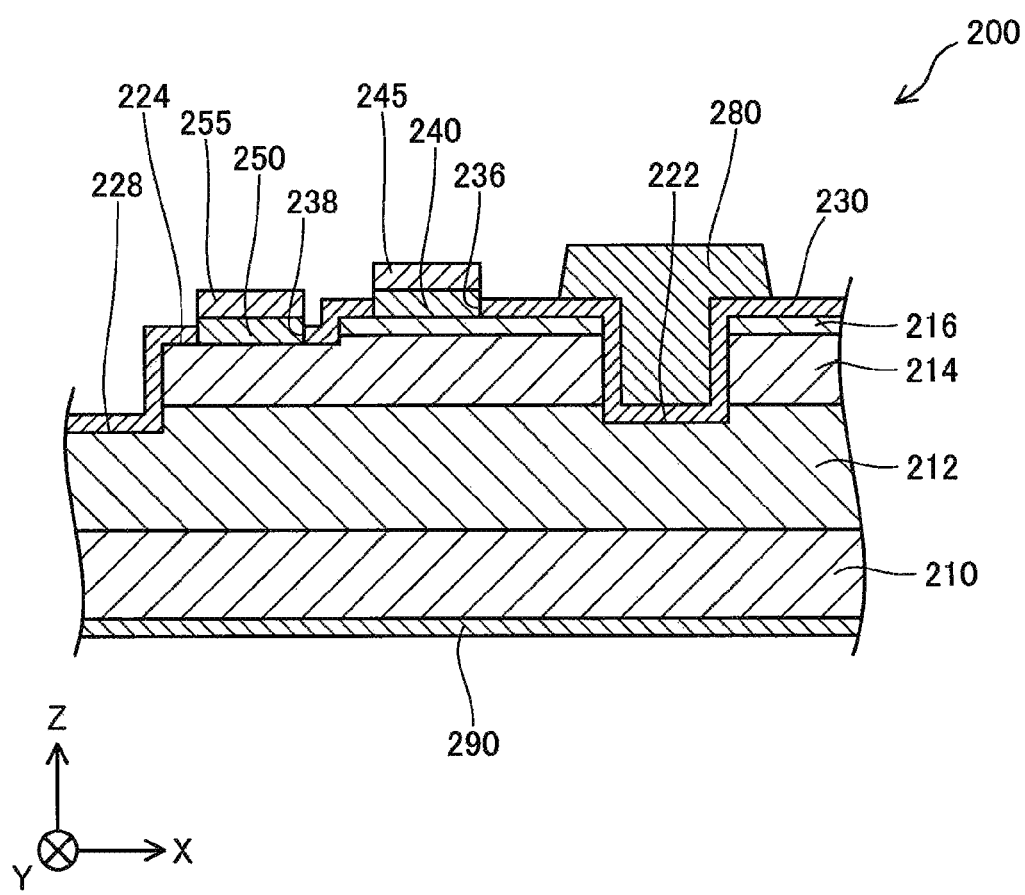
FIG. 9 is a sectional view schematically illustrating the configuration of a semiconductor device according to a second embodiment.

FIG. 9 is a sectional diagram schematically illustrating the configuration of a semiconductor device 200 according to a second embodiment. XYZ axes orthogonal to one another are illustrated in FIG. 9, like FIG. 1.

The semiconductor device 200 is a GaN-based semiconductor device formed using gallium nitride (GaN). According to this embodiment, the semiconductor device 200 is a vertical trench MOSFET (metal-oxide-semiconductor field effect transistor). According to this embodiment, the semiconductor device 200 is used for power control and is also called power device.

The semiconductor device 200 includes a substrate 210, a semiconductor layer 212, a semiconductor layer 214 and a semiconductor layer 216. The semiconductor device 200 has a trench 222, a recess 224 and a trench 228 as structures formed in these semiconductor layers. The semiconductor device 200 also includes an insulating film 230, a source electrode 240, a molybdenum layer 245, a body electrode 250, a molybdenum layer 255, a gate electrode 280 and a drain electrode 290.

The substrate 210 of the semiconductor device 200 is a plate-like semiconductor extended along the X axis and the Y axis. According to this embodiment, the substrate 210 is mainly made of gallium nitride (GaN). According to this embodiment, the substrate 210 is an n-type semiconductor containing silicon (Si) as the donor element. According to this embodiment, the average concentration of silicon (Si) contained in the substrate 210 is about $1\times10^{18}$ cm$^{-3}$.

The semiconductor layer 212 of the semiconductor device 200 is a semiconductor layer that is located on the +Z-axis direction side of the substrate 210 and is extended along the X axis and the Y axis. According to this embodiment, the semiconductor layer 212 is mainly made of gallium nitride (GaN). According to this embodiment, the semiconductor layer 212 is an n-type semiconductor containing silicon (Si) as the donor element. According to this embodiment, the average concentration of silicon (Si) contained in the semiconductor layer 212 is about $1\times10^{16}$ cm$^{-3}$. According to this embodiment, the thickness (length in the Z-axis direction) of the semiconductor layer 212 is about 10 μm (micrometers).

The semiconductor layer 214 of the semiconductor device 200 is a semiconductor layer that is located on the +Z-axis direction side of the semiconductor layer 212 and is extended along the X axis and the Y axis. According to this embodiment, the semiconductor layer 214 is mainly made of gallium nitride (GaN). According to this embodiment, the semiconductor layer 214 is a p-type semiconductor containing magnesium (Mg) as the acceptor element. According to this embodiment, the average concentration of magnesium (Mg) contained in the semiconductor layer 214 is about $4\times10^{18}$ cm$^{-3}$. According to this embodiment, the thickness (length in the Z-axis direction) of the semiconductor layer 214 is about 1.0 μm.

The semiconductor layer 216 of the semiconductor device 200 is a semiconductor layer that is located on the +Z-axis direction side of the semiconductor layer 214 and is extended along the X axis and the Y axis. According to this embodiment, the semiconductor layer 216 is mainly made of gallium nitride (GaN). According to this embodiment, the semiconductor layer 216 is an n-type semiconductor containing silicon (Si) as the donor element. According to this embodiment, the average concentration of silicon (Si) contained in the semiconductor layer 216 is about $3\times10^{18}$ cm$^{-3}$. According to this embodiment, the thickness (length in the Z-axis direction) of the semiconductor layer 216 is about 0.2 μm.

The trench 222 of the semiconductor device 200 is a groove that is formed in the semiconductor layers 212, 214 and 216 to be recessed in the thickness direction (−Z-axis direction) of the semiconductor layers 212, 214 and 216. The trench 222 is formed from the +Z-axis direction side of the semiconductor layer 216 to penetrate through the semiconductor layer 214 and reach the semiconductor layer 212. According to this embodiment, the trench 222 is formed by dry etching of the semiconductor layers 212, 214 and 216.

The recess 224 of the semiconductor device 200 is a concave that is formed from the +Z-axis direction side of the semiconductor layer 216 into the semiconductor layer 214. According to this embodiment, the recess 224 is a structure formed by dry etching of the semiconductor layers 214 and 216.

The trench 228 of the semiconductor device 200 is a groove that is formed in the semiconductor layers 212, 214 and 216 at a position away from the trench 222 to be recessed in the thickness direction (−Z-axis direction) of the semiconductor layers 212, 214 and 216. The trench 228 is formed from the +Z-axis direction side of the semiconductor layer 216 to penetrate through the semiconductor layer 214 and reach the semiconductor layer 212. The trench 228 accordingly serves to isolate the semiconductor device 200 from other elements formed on the substrate 210. According to this embodiment, the trench 228 is formed by dry etching of the semiconductor layers 212, 214 and 216.

The insulating film 230 of the semiconductor device 200 is a film having electrical insulating properties. The insulating film 230 is formed from inside to outside of the trench 222. According to this embodiment, the insulating film 230 is formed on +Z-axis direction side interfaces of the semiconductor layer 214 and the semiconductor layer 216 and from inside to outside of the trench 228, in addition to from inside to outside of the trench 222. According to this embodiment, the insulating film 230 is mainly made of silicon dioxide ($SiO_2$). According to this embodiment, the insulating film 230 is a film formed by atomic layer deposition (ALD).

The insulating film 230 has a contact hole 236 and a contact hole 238. The contact hole 236 is an opening formed to penetrate through the insulating film 230 and reach the semiconductor layer 216. The contact hole 238 is an opening formed to penetrate through the insulating film 230 and reach the semiconductor layer 214. According to this embodiment, the contact holes 236 and 238 are structures formed by wet etching of the insulating film 230.

The source electrode 240 of the semiconductor device 200 is an electrode formed in the contact hole 236. The source electrode 240 is in ohmic contact with the semiconductor layer 216 that is the n-type semiconductor. According to this embodiment, the source electrode 240 is an electrode obtained by stacking a layer of about 200 nm in thickness mainly made of aluminum (Al) on a layer of about 30 nm in thickness mainly made of titanium (Ti) and subsequently processing the stacked layers by annealing (heat treatment).

The molybdenum layer 245 of the semiconductor device 200 is a metal layer that is mainly made of molybdenum (Mo) and is processed by heat treatment at temperature of not lower than 200° C. According to this embodiment, the molybdenum layer 245 is formed on the source electrode 240. According to this embodiment, the molybdenum layer 245 is a metal layer formed by electron beam deposition. According to this embodiment, the molybdenum layer 245 is a metal layer processed by heat treatment at temperature of 400° C.

The body electrode 250 of the semiconductor device 200 is an electrode formed in the contact hole 238. The body electrode 250 is in ohmic contact with the semiconductor layer 214. According to this embodiment, the body electrode 250 is an electrode obtained by stacking a layer mainly made of nickel (Ni) on the semiconductor layer 214 and subsequently processing the stacked layers by annealing (heat treatment). According to another embodiment, the body electrode 250 may be an electrode obtained by further stacking a layer mainly made of at least one of palladium (Pd) and cobalt (Co) on the layer mainly made of nickel (Ni).

The molybdenum layer 255 of the semiconductor device 200 is a metal layer that is mainly made of molybdenum (Mo) and is processed by heat treatment at temperature of not lower than 200° C. According to this embodiment, the molybdenum layer 255 is formed on the body electrode 250. According to this embodiment, the molybdenum layer 255 is a metal layer formed by electron beam deposition. According to this embodiment, the molybdenum layer 255 is a metal layer processed by heat treatment at temperature of 400° C.

The gate electrode 280 of the semiconductor device 200 is an electrode formed in the trench 222 via the insulating film 230. According to this embodiment, the gate electrode 280 is mainly made of aluminum (Al). When a voltage is applied to the gate electrode 280, an inversion layer is formed in the semiconductor layer 214 to serve as a channel, and a conductive path is formed between the source electrode 240 and the drain electrode 290.

The drain electrode 290 of the semiconductor device 200 is an electrode formed on a −Z-axis direction side interface of the substrate 110. The drain electrode 290 is in ohmic contact with the substrate 210. According to this embodiment, the drain electrode 290 is an electrode obtained by staking a layer mainly made of aluminum (Al) on a layer mainly made of titanium (Ti) and subsequently processing the stacked layers by annealing (heat treatment).

B-2. Method of Manufacturing Semiconductor Layer

Figure 10:
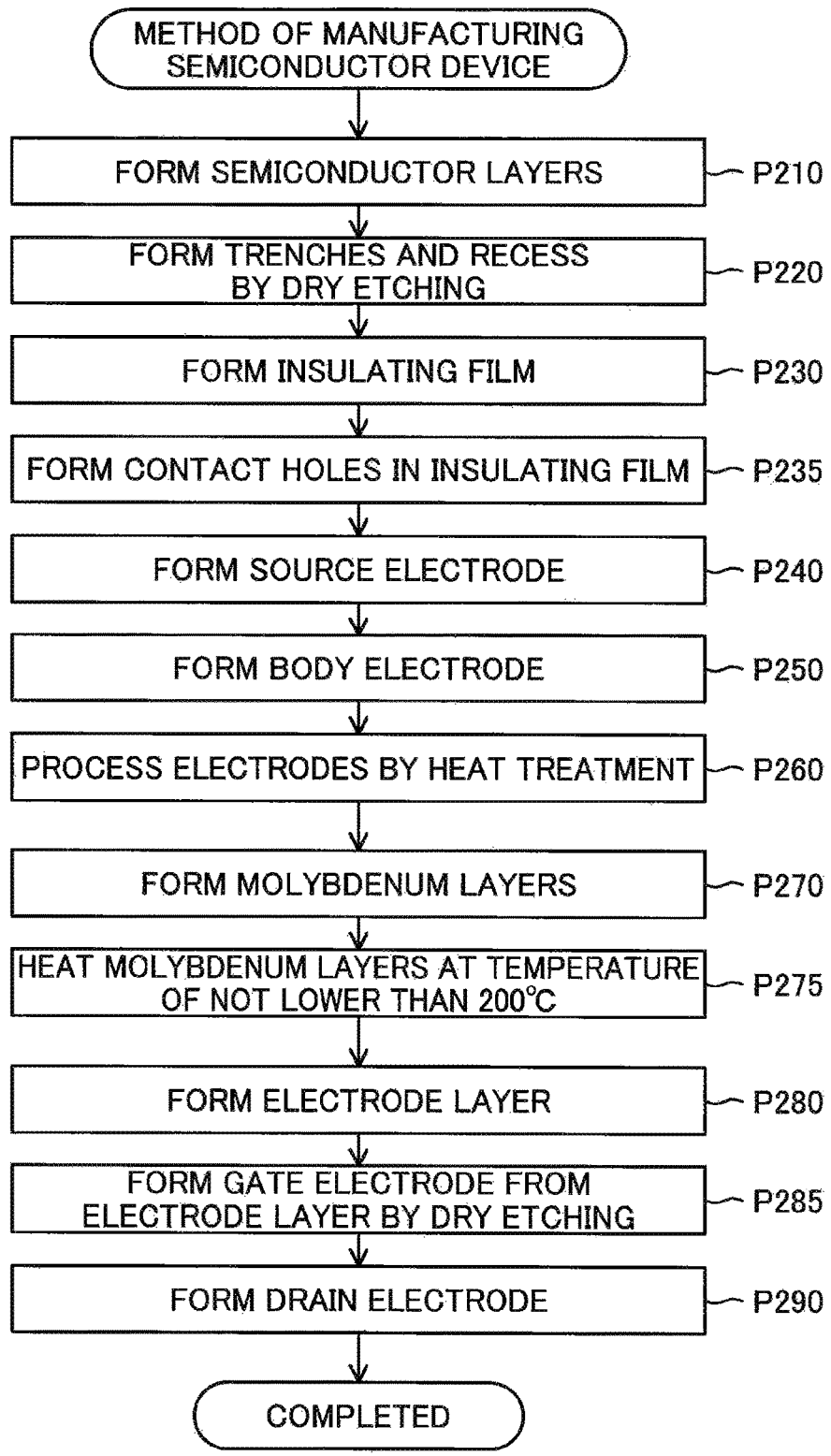
FIG. 10 is a process chart showing a method of manufacturing the semiconductor device according to the second embodiment.
Figure 11:
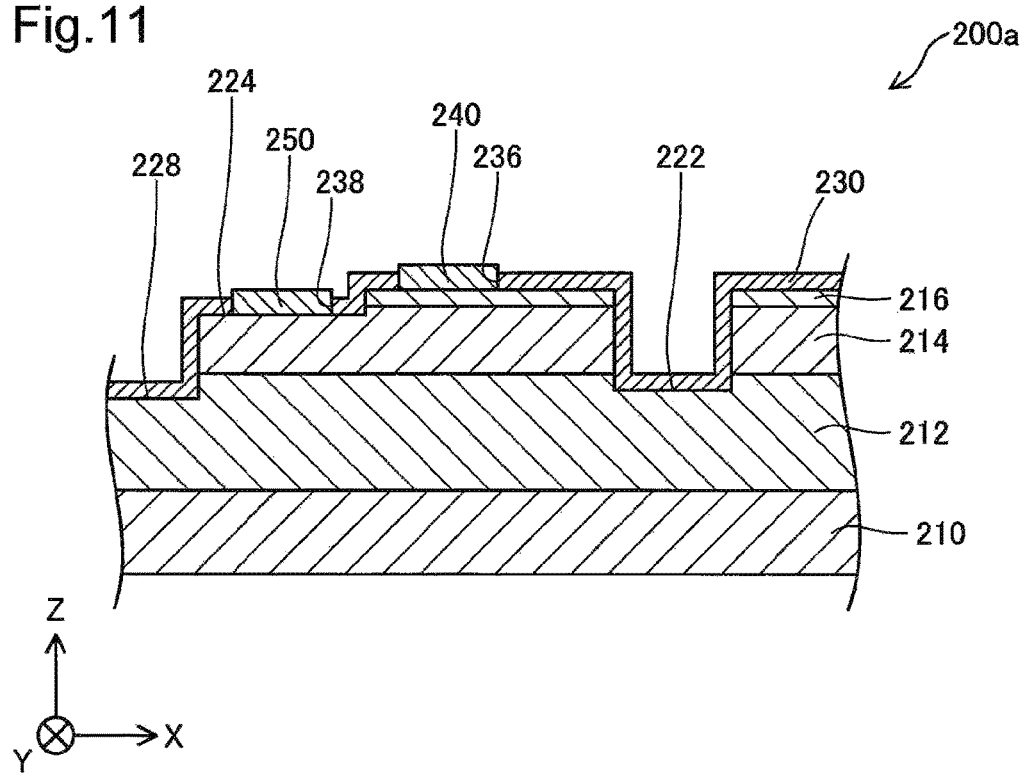
FIG. 11 is a diagram illustrating a process of manufacturing the semiconductor device.

FIG. 10 is a process chart showing a method of manufacturing the semiconductor device 200 according to the second embodiment. FIGS. 11 to are diagrams illustrating the processes of manufacturing the semiconductor device 200.

The manufacturer of the semiconductor device 200 first forms the semiconductor layers 212, 214 and 216 on the substrate 210 by epitaxial growth (process P210). According to this embodiment, the manufacturer forms the semiconductor layers 212, 214 and 216 by metal organic chemical vapor deposition (MOCVD).

After forming the semiconductor layers 212, 214 and 216 (process P210), the manufacturer forms the trenches 222 and 228 and the recess 224 by dry etching (process P220). According to this embodiment, the manufacturer forms the trenches 222 and 228 and the recess 224 by dry etching using a chlorine-based gas.

After forming the trenches 222 and 228 and the recess 224 (process P220), the manufacturer forms the insulating film 230 (process P230). According to this embodiment, the manufacturer forms the insulating film 230 mainly made of silicon dioxide ($SiO_2$) by atomic layer deposition (ALD).

After forming the insulating film 230 (process P230), the manufacturer forms the contact holes 236 and 238 in the insulating film 230 by wet etching (process P235).

After forming the contact holes 236 and 238 (process P235), the manufacturer forms the source electrode 240 (process P240). According to this embodiment, the manufacturer forms a layer of about 30 nm in thickness mainly made of titanium (Ti) on the semiconductor layer 216 exposed on the contact hole 236 by vapor deposition and subsequently stacks a layer of about 200 nm in thickness mainly made of aluminum (Al) by vapor deposition, so as to form the source electrode 240.

After forming the source electrode 240 (process P240), the manufacturer forms the body electrode 250 (process P250, FIG. 11). According to this embodiment, the manufacturer forms a layer mainly made of palladium (Pd) on the semiconductor layer 214 exposed on the contact hole 238 by vapor deposition, so as to form the body electrode 250. By forming the body electrode 250, the manufacturer obtains a semiconductor device 200a including the insulating film 230, the source electrode 240 and the body electrode 250 as an intermediate product of the semiconductor device 200.

After forming the source electrode 240 and the body electrode 250 (processes P240 and P250), the manufacturer processes the source electrode 240 and the body electrode 250 by heat treatment (annealing) (process P260). This heat treatment reduces the contact resistance of the source electrode 240 and the body electrode 250. The time of heat treatment is required to be between 1 minute and 10 minutes, inclusive. The temperature of heat treatment is required to be between 500° C. and 700° C., inclusive. The atmosphere of heat treatment may be nitrogen ($N_2$) or argon (Ar), may contain oxygen, or may be vacuum. According to this embodiment, the manufacturer processes the source electrode 240 and the body electrode 250 by heat treatment in an atmosphere mainly made of nitrogen at temperature of 550° C. for 5 minutes. According to another embodiment, the manufacturer may separately process the source electrode 240 and the body electrode 250 by heat treatment.

Figure 12:
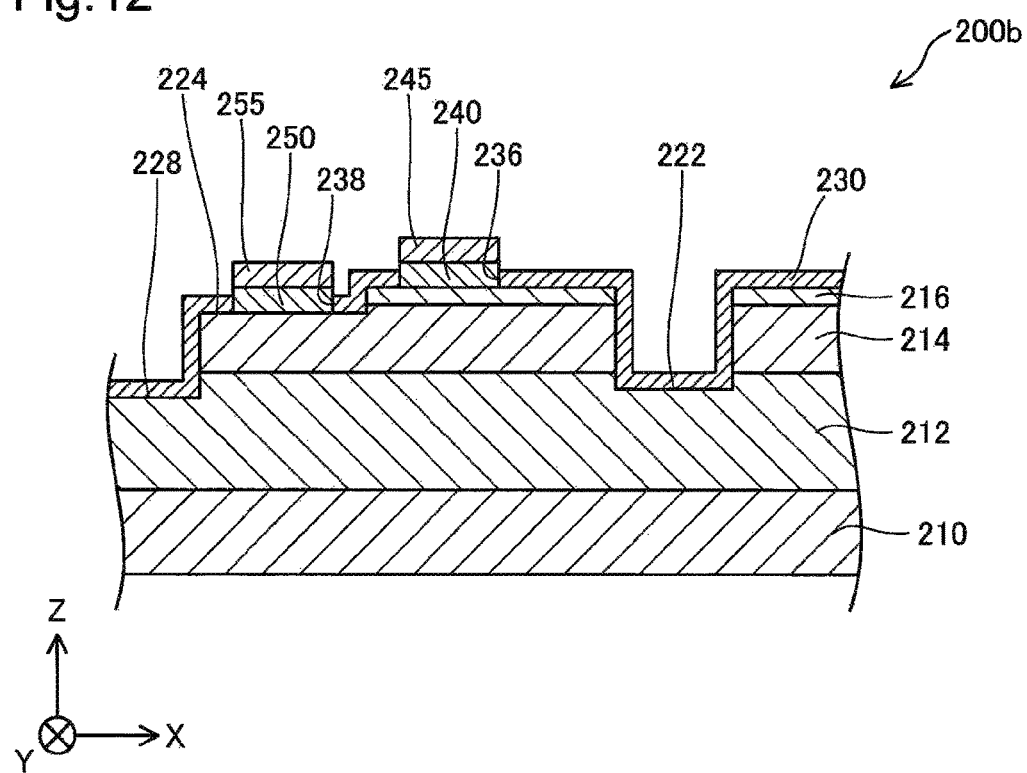
FIG. 12 is a diagram illustrating a process of manufacturing the semiconductor device.

After processing the source electrode 240 and the body electrode 250 by heat treatment (process P260), the manufacturer forms the molybdenum layers 245 and 255 (process P270, FIG. 12). The manufacturer accordingly obtains a semiconductor device 200b including the molybdenum layers 245 and 255 respectively formed on the source electrode 240 and the body electrode 250 as an intermediate product of the semiconductor device 200.

According to this embodiment, the manufacturer forms the molybdenum layers 245 and 255 by electron beam deposition using the lift-off method. The method employable to form the molybdenum layers 245 and 255 is, however, not limited to electron beam deposition but may be resistive heating vapor deposition or sputtering. According to another embodiment, the manufacturer may form a metal layer over the entire +Z-axis direction side surface of the semiconductor device 200a and remove part of the metal layer to form the molybdenum layers 245 and 255. According to this embodiment, the manufacturer forms layers of about 20 nm in thickness mainly made of molybdenum (Mo) on the source electrode 240 and on the body electrode 250 to form the molybdenum layers 245 and 255. The molybdenum layers 245 and 255 are required to have sufficient thicknesses for protecting the source electrode 240 and the body electrode 250 in a downstream process of forming the gate electrode 280 by dry etching.

After forming the molybdenum layers 245 and 255 (process P270), the manufacturer heats the molybdenum layers 245 and 255 at temperature of not lower than 200° C. (process P275). This enhances the resistance of the molybdenum layers 245 and 255 to dry etching. The temperature of heating the molybdenum layers 245 and 255 (heat treatment temperature) is not lower than 200° C. in a range that does not deteriorate the ohmic characteristic of the source electrode 240 and the body electrode 250, and is 400° C. according to this embodiment.

According to this embodiment, the manufacturer heats the molybdenum layers 245 and 255 in an atmosphere mainly made of nitrogen ($N_2$). According to another embodiment, the manufacturer may heat the molybdenum layers 245 and 255 in an atmosphere mainly made of one of argon (Ar) and oxygen ($O_2$) or may heat the molybdenum layers 245 and 255 in vacuum. The time of heating the molybdenum layers 245 and 255 (heating time) is required to be between 1 minute and 10 minutes inclusive, and is 5 minutes according to this embodiment. According to another embodiment, the manufacturer may process the molybdenum layers 245 and 255 simultaneously with the source electrode 240 and 250 by heat treatment, instead of separately processing the source electrode 240 and the body electrode 250 by heat treatment and processing the molybdenum layers 245 and 255 by heat treatment.

Figure 13:
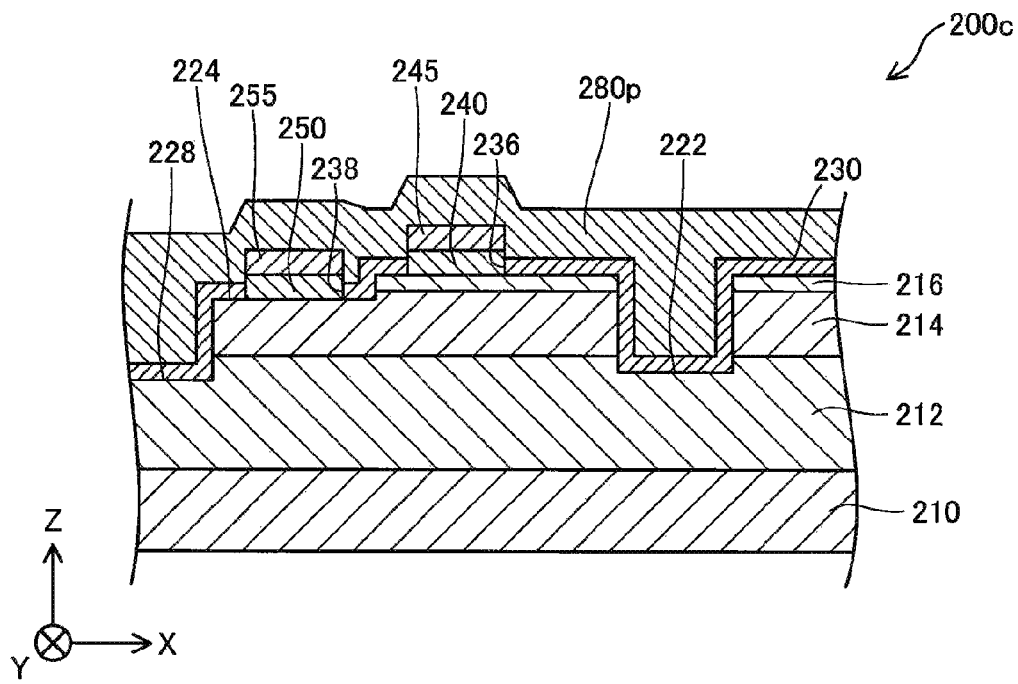
FIG. 13 is a diagram illustrating a process of manufacturing the semiconductor device.

After heating the molybdenum layers 245 and 255 (process P275), the manufacturer forms an electrode layer 280p as the base of the gate electrode 280 over the entire +Z-axis direction side surface of the semiconductor device 200b (process P280, FIG. 13). The manufacturer accordingly obtains a semiconductor device 200c including the electrode layer 280p formed over the entire +Z-axis direction side surface as an intermediate product of the semiconductor device 200. According to this embodiment, the manufacturer forms a layer mainly made of aluminum (Al) as the electrode layer 280p by sputtering.

Figure 14:
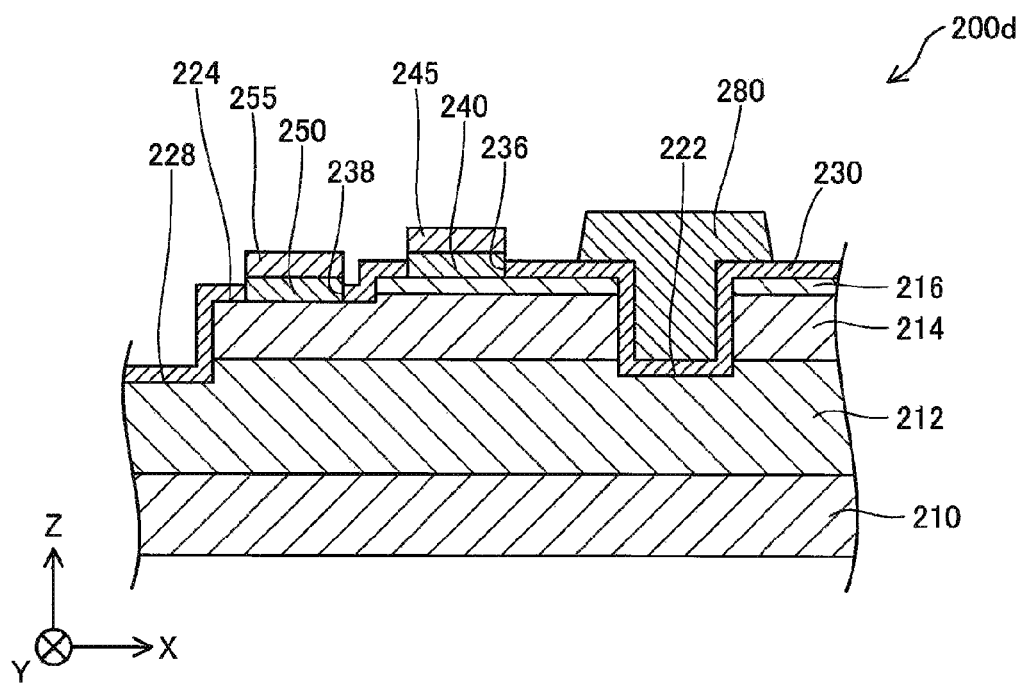
FIG. 14 is a diagram illustrating a process of manufacturing the semiconductor device.

After forming the electrode layer 280p (process P280), the manufacturer forms the gate electrode 280 from the electrode layer 280p by dry etching of the semiconductor device 200c including the electrode layer 280p (process P285, FIG. 14). The manufacturer accordingly obtains a semiconductor device 200d including the gate electrode 280 as an intermediate product of the semiconductor device 200. According to this embodiment, the manufacturer removes part of the electrode layer 280p other than an area corresponding to the trench 222 and its periphery by dry etching to form the gate electrode 280 as the remaining part of the electrode layer 280p by dry etching.

According to this embodiment, the manufacturer forms the gate electrode 280 from the electrode layer 280p by inductively-coupled plasma (ICP) dry etching using a mixed gas mainly made of chlorine ($Cl_2$), boron chloride ($BCl_2$) and nitrogen ($N_2$). In the process of forming the gate electrode 280 by dry etching (process P280), the molybdenum layers 245 and 255 serve as protective films to protect the source electrode 240 and the body electrode 250 from dry etching. According to this embodiment, the molybdenum layers 245 and 255 are left on the source electrode 240 and the body electrode 250 even after dry etching. According to another embodiment, at least part of the molybdenum layers 245 and 255 may disappear from top of the source electrode 240 and the body electrode 250 by dry etching.

After forming the gate electrode 280 (process P285), the manufacturer forms the drain electrode 290 on the −Z-axis direction side of the substrate 210 (process P290). According to this embodiment, the manufacturer forms the drain electrode 290 by stacking a layer mainly made of aluminum (Al) on a layer mainly made of titanium (Ti) and subsequently processing the stacked layers by annealing (heat treatment). The semiconductor device 200 is completed by the above series of processes.

B-3. Evaluation Test

Figure 15:
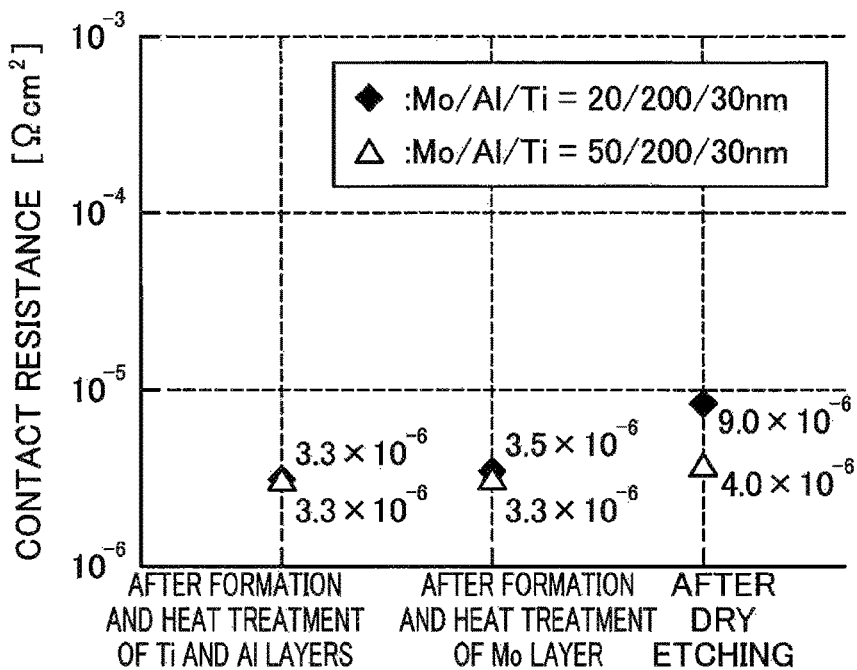

FIG. 15 is a graph showing the results of evaluation on the contact resistance of each electrode which a molybdenum layer is stacked on. In the evaluation test of FIG. 15, the examiner formed an n-type semiconductor layer like the semiconductor layer 216 on a substrate mainly made of sapphire via a buffer layer and a GaN-based intrinsic semiconductor layer. The examiner subsequently formed an electrode on the n-type semiconductor layer, like the source electrode 240 of the semiconductor device 200. This electrode was obtained by stacking a layer of about 200 nm in thickness mainly made of aluminum (Al) on a layer of about 30 nm in thickness mainly made of titanium (Ti) and subsequently processing the stacked layers by annealing (heat treatment).

The examiner produced a sample B1 by forming a molybdenum layer of about 20 nm in thickness heated at heat treatment temperature of 200° C. on the electrode that was formed on the n-type semiconductor layer, like the molybdenum layer 245 of the semiconductor device 200. The examiner also produced a sample B2 by forming a molybdenum layer of about 50 nm in thickness heated at the heat treatment temperature of 200° C. The examiner additionally produced a sample B1' that was different from the sample B1 by no heat treatment of the molybdenum layer and produced a sample B2' that was different from the sample B2 by no heat treatment of the molybdenum layer.

After providing the samples B1 and B2 and the samples B1' and B2', the examiner formed a photoresist mask on each of the samples to expose part of the molybdenum layer. The examiner subsequently processed the molybdenum layer exposed on the photoresist mask in each sample by inductively-coupled plasma (ICP) dry etching using a mixed gas mainly made of chlorine ($Cl_2$), boron chloride ($BCl_2$) and nitrogen ($N_2$) for 30 seconds. The conditions of dry etching were the same as the conditions of dry etching in the evaluation test of FIG. 7. After dry etching, the electrodes were left in the samples B1 and B2, while the electrodes disappeared in the samples B1' and B2'.

The examiner measured the contact resistance of the electrode in each of the samples B1 and B2 at a time when heat treatment of the electrode was completed, at a time when heat treatment of the molybdenum layer was completed and at a time when dry etching was completed to obtain the results shown in FIG. 15. As shown in FIG. 15, the contact resistance of the electrode which the molybdenum layer is stacked on is not significantly changed from the contact resistance prior to formation of the molybdenum layer. The contact resistance of the electrode after dry etching is reduced to or below $1.0 \times 10^{-5}$ $\Omega cm^2$. The greater thickness of the molybdenum layer leads to the greater reduction of the contact resistance of the electrode after dry etching.

Figure 16:
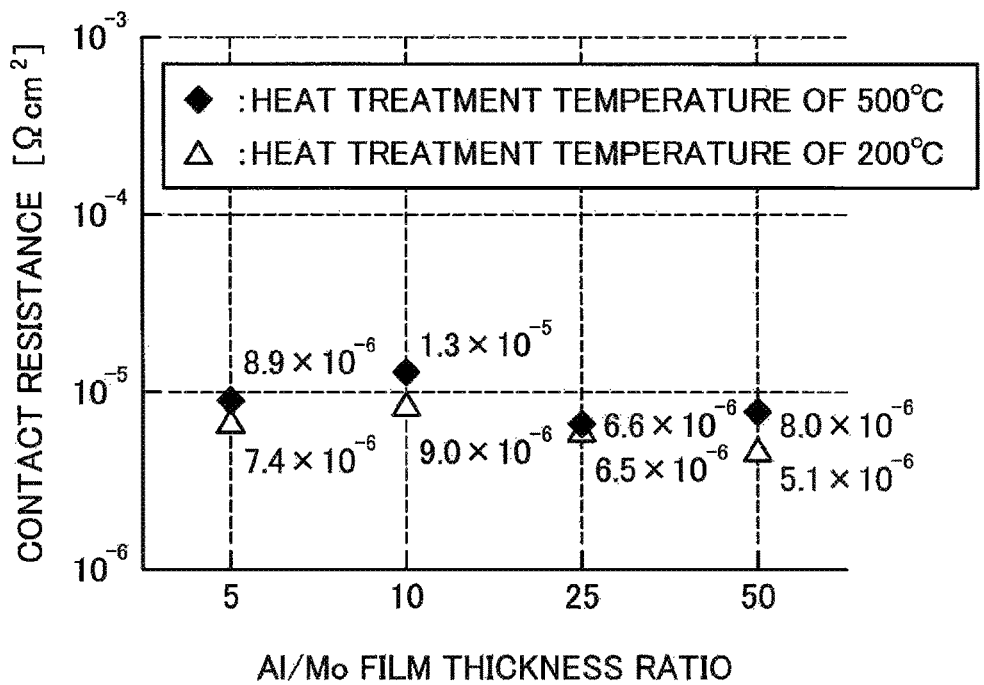

FIG. 16 is a graph showing the results of evaluation on the contact resistance of each electrode which a molybdenum layer is stacked on. In the evaluation test of FIG. 16, the examiner produced the sample B1 of FIG. 15 and a plurality of samples having different thicknesses of the aluminum layer from that of the sample B1 of FIG. 15. The thicknesses of the aluminum layers in these samples were 100 nm, 200 nm, 500 nm and 1000 nm. Each of these samples included a molybdenum layer of 20 nm in thickness heated at heat treatment temperature of 200° C. Additionally, the examiner similarly produced a plurality of samples, each including a molybdenum layer of 20 nm in thickness heated at heat treatment temperature of 500° C.

The examiner processed each of the samples by dry etching like the evaluation test of FIG. 15 and measured the contact resistance of the electrode in each sample to obtain the results of FIG. 16. As shown in FIG. 16, the molybdenum layer processed by heat treatment suppresses an increase in contact resistance of the electrode by dry etching, irrespective of the thickness of the aluminum layer located below the molybdenum layer.

B-4. Advantageous Effects

According to the second embodiment described above, the molybdenum layers 245 and 255 are heated at temperature of not lower than 200° C. This readily provides the molybdenum layers 245 and 255 as the metal layers having sufficient resistance to dry etching. This results in reducing the manufacturing cost of the semiconductor device 200.

The molybdenum layers 245 and 255 protect the source electrode 240 and the body electrode 250 respectively located below the molybdenum layers 245 and 255 from damage by dry etching. When the molybdenum layer 245 is regarded as part of the source electrode 240, the molybdenum layer 245 enhances the resistance of the source electrode 240 to dry etching. When the molybdenum layer 255 is regarded as part of the body electrode 250, the molybdenum layer 255 enhances the resistance of the body electrode 250 to dry etching.

The procedure of the second embodiment heats the source electrode 240 and the body electrode 250 (process P260) before forming the molybdenum layers 245 and 255 (process P270). This procedure enables the electrical properties of the source electrode 240 and the body electrode 250 to be more readily adjusted, compared with a procedure of heating the source electrode 240 and the body electrode 250 after forming the molybdenum layers 245 and 255.

C. Third Embodiment

Figure 17:
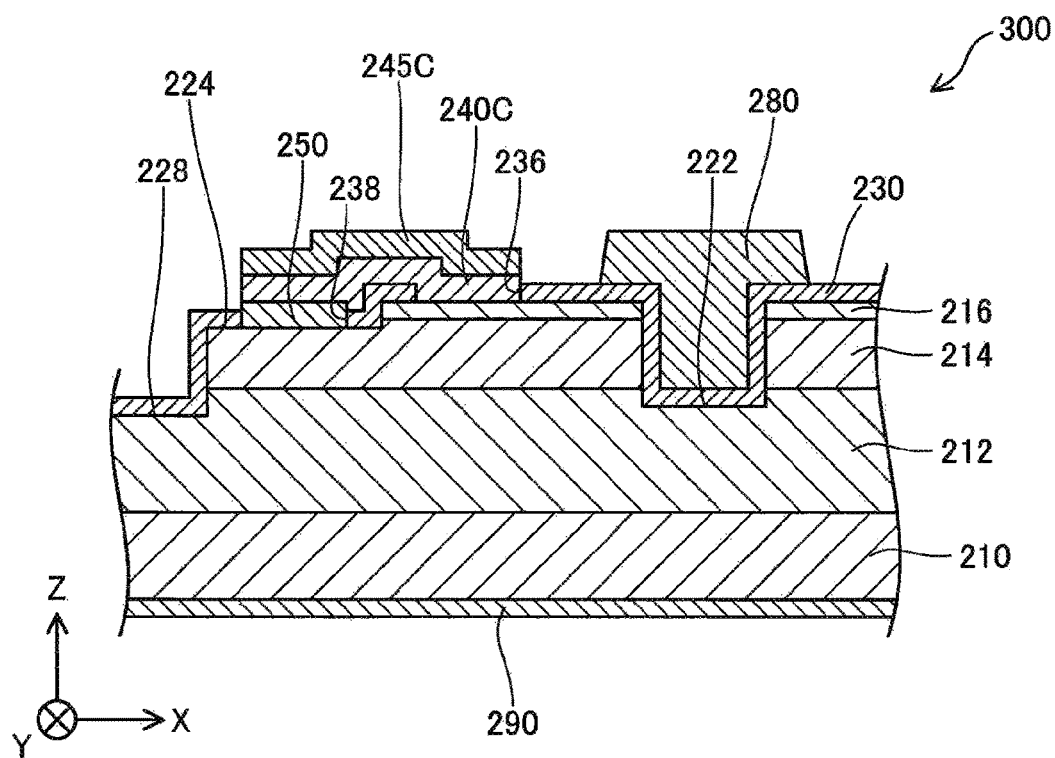
FIG. 17 is a sectional view schematically illustrating the configuration of a semiconductor device according to a third embodiment.

FIG. 17 is a sectional view schematically illustrating the configuration of a semiconductor device 300 according to a third embodiment. The configuration of the semiconductor device 300 is similar to the configuration of the semiconductor device 200 of the second embodiment, except that a source electrode 240C is provided in place of the source electrode 240 and that a molybdenum layer 245C is provided in place of the molybdenum layers 245 and 255.

The source electrode 240C of the semiconductor device 300 is similar to the source electrode 240 of the second embodiment, except that the source electrode 240C is formed from inside of the contact hole 236 over the body electrode 250. The molybdenum layer 245C of the semiconductor layer 300 is similar to the molybdenum layers 245 and 255 of the second embodiment except that the molybdenum layer 245C is formed on the source electrode 240C to cover the body electrode 250 via the source electrode 240C. This configuration facilitates miniaturization of the semiconductor device 300.

According to the third embodiment described above, like the second embodiment, the molybdenum layer 245C is heated at temperature of not lower than 200° C. This readily provides the molybdenum layer 245C as the metal layer having sufficient resistance to dry etching. This results in reducing the manufacturing cost of the semiconductor device 300.

The molybdenum layer 245C protects the source electrode 240C and the body electrode 250 located below the molybdenum layer 245C from damage by dry etching. When the molybdenum layer 245C is regarded as part of the source electrode 240C, the molybdenum layer 245C enhances the resistance of the source electrode 240C to dry etching. When the molybdenum layer 245C is regarded as part of the body electrode 250, the molybdenum layer 245C enhances the resistance of the body electrode 250 to dry etching.

D. Fourth Embodiment

Figure 18:
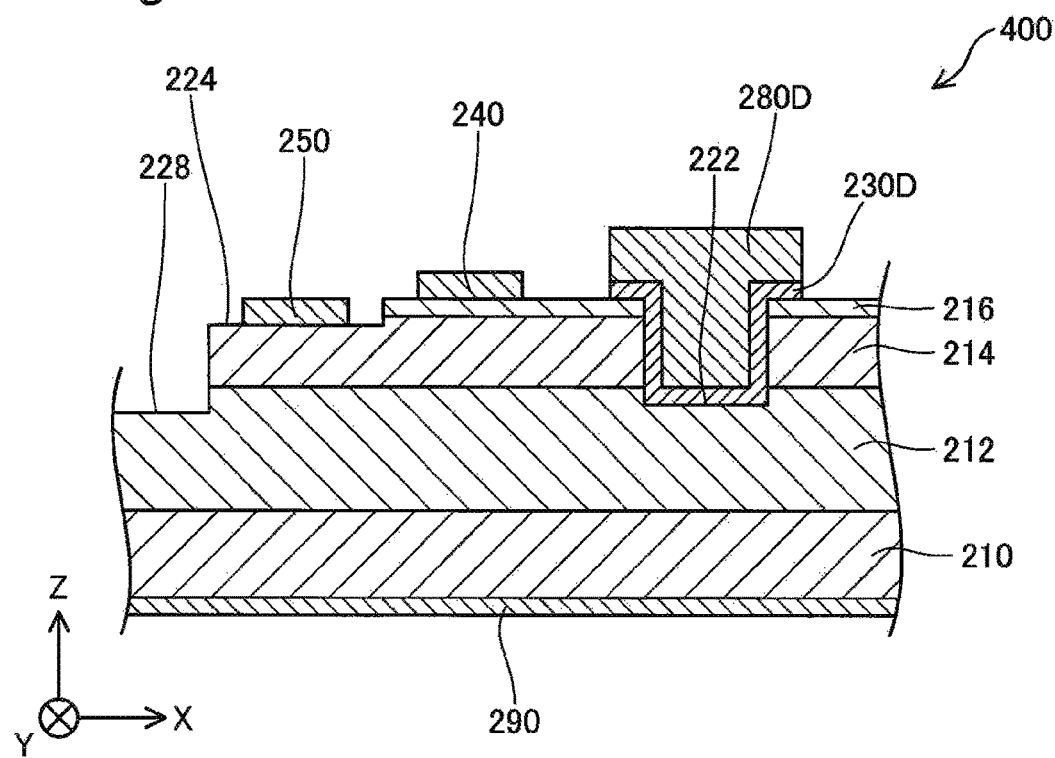
FIG. 18 is a sectional view schematically illustrating the configuration of a semiconductor device according to a fourth embodiment.

FIG. 18 is a sectional view schematically illustrating the configuration of a semiconductor device 400 according to a fourth embodiment. The configuration of the semiconductor device 400 is similar to the configuration of the semiconductor device 200 of the second embodiment, except that the molybdenum layers 245 and 255 are excluded, that an insulating film 230D is provided in place of the insulating film 230 and that a gate electrode 280D is provided in place of the gate electrode 280.

The insulating film 230D of the semiconductor device 400 is similar to the insulating film 230 of the second embodiment, except that the insulating film 230D is formed below (on the −Z-axis direction side of) the gate electrode 280D. The gate electrode 280D of the semiconductor device 400 is similar to the gate electrode 280 of the second embodiment, except that the gate electrode 280D is mainly made of molybdenum (Mo).

Figure 19:
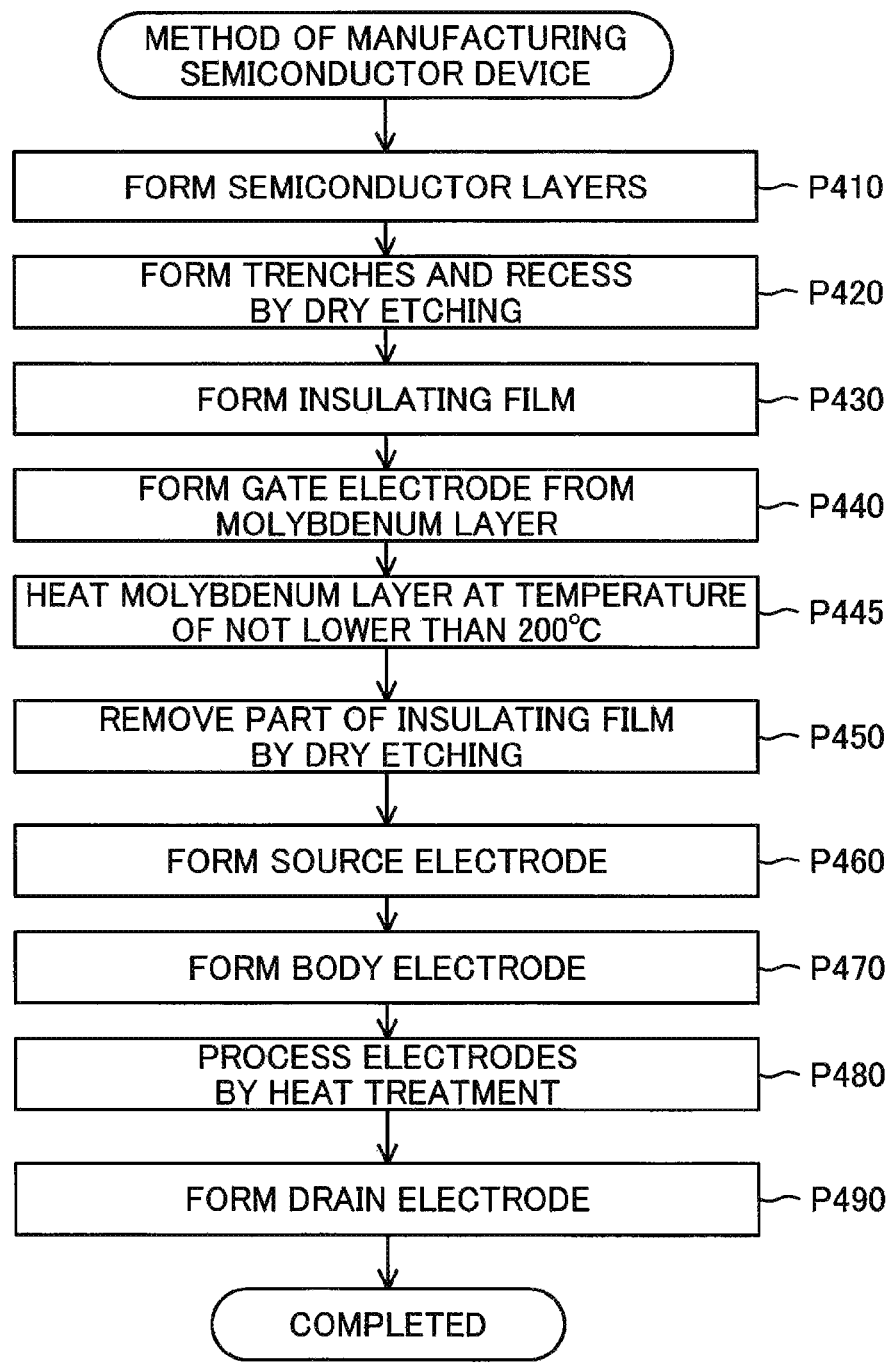
FIG. 19 is a process chart showing a method of manufacturing the semiconductor device according to the fourth embodiment.
Figure 20:
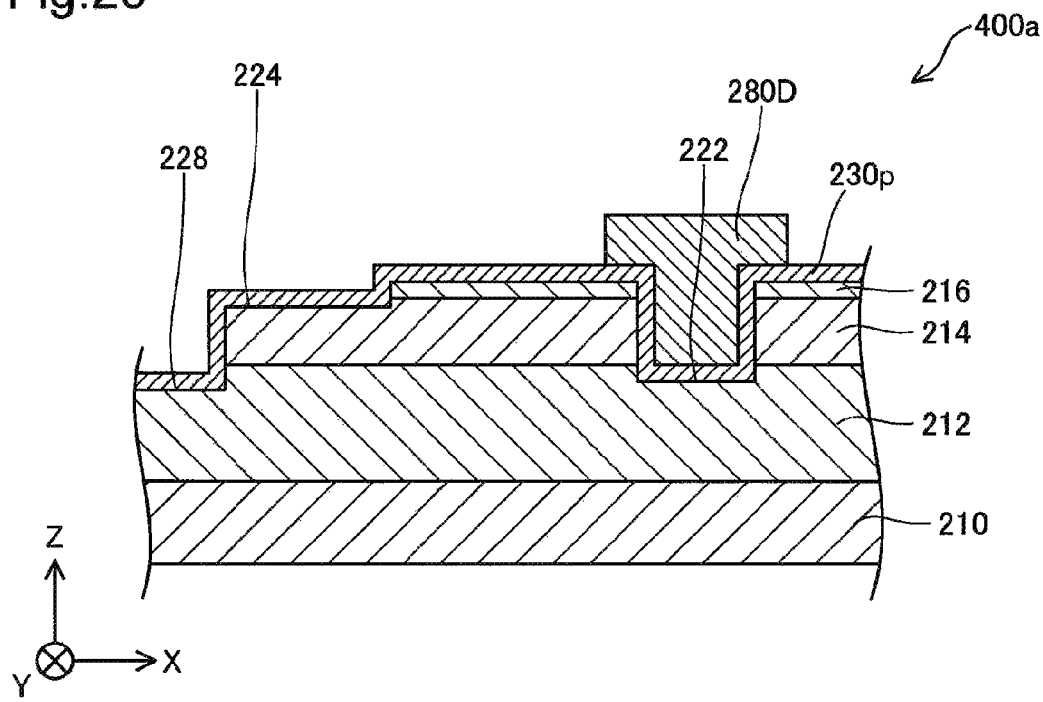
FIG. 20 is a diagram illustrating a process of manufacturing the semiconductor device.

FIG. 19 is a process chart showing a method of manufacturing the semiconductor device 400 according to the fourth embodiment. FIGS. 20 and are diagrams illustrating the processes of manufacturing the semiconductor device 400.

The manufacturer of the semiconductor device 400 first forms the semiconductor layers 212, 214 and 216 on the substrate 210 by epitaxial growth (process P410), like the second embodiment. The manufacturer subsequently forms the trenches 222 and 228 and the recess 224 by dry etching (process P420), like the second embodiment. The manufacturer then forms an insulating film 230p (process P430), like the insulating film 230 of the second embodiment.

After forming the insulating film 230p (process P430), the manufacturer forms the gate electrode 280D as a molybdenum layer mainly made of molybdenum (Mo) (process P440, FIG. 20). The manufacturer accordingly obtains a semiconductor device 400a including the insulating film 230p and the gate electrode 280D as an intermediate product of the semiconductor device 400.

According to this embodiment, the manufacturer forms the gate electrode 280D by electron beam deposition using the lift-off method. The method employable to form the gate electrode 280D is, however, not limited to electron beam deposition but may be resistive heating vapor deposition or sputtering. According to another embodiment, the manufacturer may form a metal layer over the entire +Z-axis direction side surface of the semiconductor device 400a and subsequently remove part of the metal layer to form the gate electrode 280D. The gate electrode 280D is required to have sufficiently large thickness, compared with the thickness of the insulating film 230p.

After forming the gate electrode 280D (process P440), the manufacturer heat the gate electrode 280D at temperature of not lower than 200° C. (process P445). This enhances the resistance of the gate electrode 280D to dry etching. The temperature of heating the gate electrode 280D (heat treatment temperature) is required to be not lower than 200° C. and is 400° C. according to this embodiment.

According to this embodiment, the manufacturer heats the gate electrode 280D in an atmosphere mainly made of nitrogen ($N_2$). According to another embodiment, the manufacturer may heat the gate electrode 280D in an atmosphere mainly made of at least one of argon (Ar) and oxygen ($O_2$) or may heat the gate electrode 280D in vacuum. The time of heating the gate electrode 280D (heating time) is required to be between 1 minute and 10 minutes, inclusive. According to this embodiment, the heating time is 5 minutes.

Figure 21:
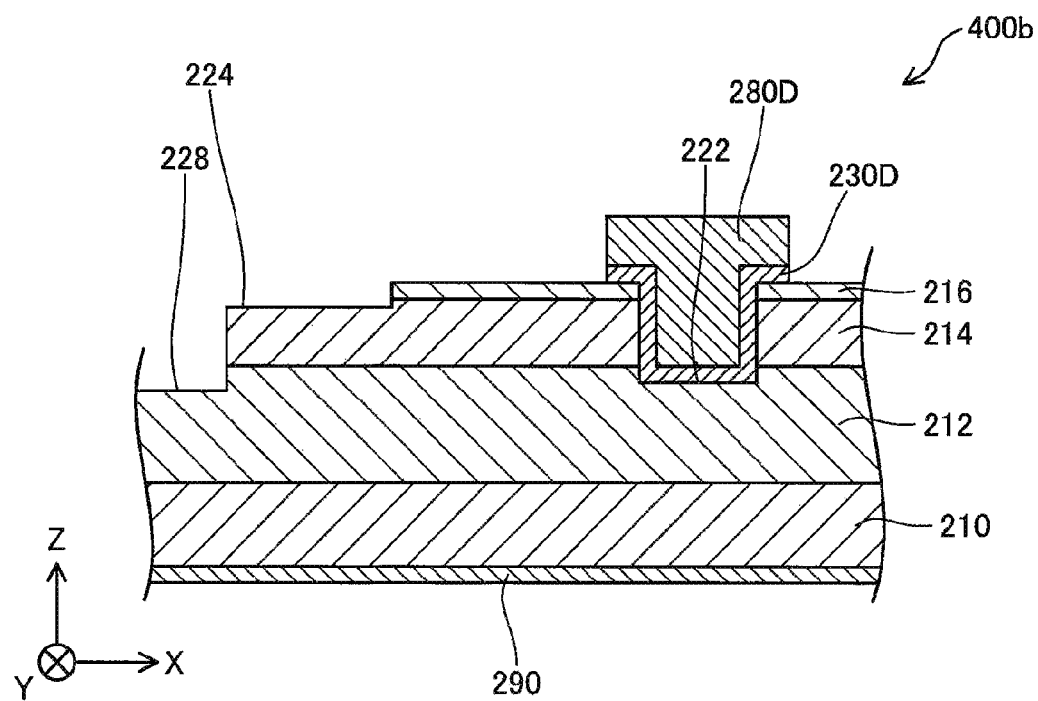
FIG. 21 is a diagram illustrating a process of manufacturing the semiconductor device.

After heating the gate electrode 280D (process P445), the manufacturer removes part of the insulating film 230p by dry etching to form the insulating film 230D as the remaining part of the insulating film 230p by dry etching (process P450, FIG. 21). The manufacturer accordingly obtains a semiconductor device 400b including the insulating film 230D as an intermediate product of the semiconductor device 400.

According to this embodiment, the manufacturer forms the insulating film 230D from the insulating film 230p by inductively-coupled plasma (ICP) dry etching using a mixed gas mainly made of chlorine ($Cl_2$), boron chloride ($BCl_2$) and nitrogen ($N_2$). In the process of forming the insulating film 230D by dry etching (process P450), the gate electrode 280D serves as a protective film (mask) to protect the insulating film 230D from dry etching.

After forming the insulating film 230D by dry etching (process P450), the manufacturer forms the source electrode 240 (process P460), like the second embodiment. The manufacturer subsequently forms the body electrode 250 (process P470), like the second embodiment. The manufacturer then processes the source electrode 240 and the body electrode 250 by heat treatment (process P480), like the second embodiment. The manufacturer subsequently forms the drain electrode 290 (process P490), like the second embodiment. The semiconductor device 400 is completed by the above series of processes.

According to the fourth embodiment described above, like the second embodiment, the gate electrode 280D is heated at temperature of not lower than 200° C. This readily provides the gate electrode 280D as the metal layer having sufficient resistance to dry etching. This results in reducing the manufacturing cost of the semiconductor device 400. The gate electrode 280D protects the insulating layer 230D located below the gate electrode 280D from damage by dry etching.

E. Fifth Embodiment

Figure 22:
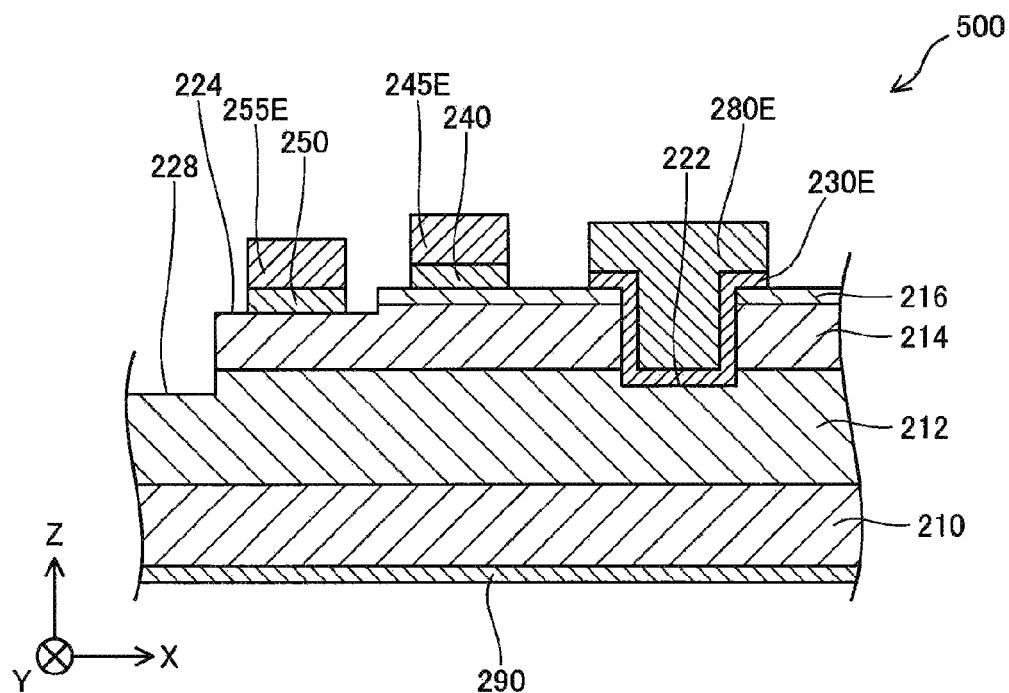
FIG. 22 is a sectional view schematically illustrating the configuration of a semiconductor device according to a fifth embodiment.

FIG. 22 is a sectional view schematically illustrating the configuration of a semiconductor device 500 according to a fifth embodiment. The configuration of the semiconductor device 500 is similar to the configuration of the semiconductor device 200 of the second embodiment, except that a molybdenum layer 245E is provided on the source electrode 240, that a molybdenum layer 255E is provided on the body electrode 250, that an insulating film 230E is provided in place of the insulating film 230 and that a gate electrode 280E is provided in place of the gate electrode 280.

The molybdenum layer 245E of the semiconductor device 500 is similar to the molybdenum layer 245 of the second embodiment, except that the molybdenum layer 245E is formed simultaneously with the gate electrode 280E. The molybdenum layer 255E of the semiconductor device 500 is similar to the molybdenum layer 255 of the second embodiment, except that the molybdenum layer 255E is formed simultaneously with the gate electrode 280E.

The insulating film 230E of the semiconductor device 500 is similar to the insulating film 230 of the second embodiment, except that the insulating film 230E is formed below (on the −Z-axis direction side of) the gate electrode 280E. The gate electrode 280E of the semiconductor device 500 is similar to the gate electrode 280 of the second embodiment, except that the gate electrode 280E is mainly made of molybdenum (Mo).

In the method of manufacturing the semiconductor device 500, the manufacturer forms the molybdenum layers 245E, 255E and the gate electrode 280E on the semiconductor device 200a (shown in FIG. 11) and heats the molybdenum layers 245E and 255E and the gate electrode 280E at temperature of not lower than 200° C., like the second embodiment. The manufacturer subsequently forms the insulating film 230E by dry etching, like the fourth embodiment. The manufacturer then forms the drain electrode 290, like the second embodiment. The semiconductor device 500 is completed by this series of processes.

According to the fifth embodiment described above, like the second embodiment, the molybdenum layers 245E and 255E and the gate electrode 280E are heated at temperature of not lower than 200° C. This readily provides the molybdenum layers 245E and 255E and the gate electrode 280E as the metal layers having sufficient resistance to dry etching. This results in reducing the manufacturing cost of the semiconductor device 500.

The molybdenum layers 245E and 255E protect the source electrode 240 and the body electrode 250 respectively located below the molybdenum layers 245E and 255E from damage by dry etching. When the molybdenum layer 245E is regarded as part of the source electrode 240, the molybdenum layer 245E enhances the resistance of the source electrode 240 to dry etching. When the molybdenum layer 255E is regarded as part of the body electrode 250, the molybdenum layer 255E enhances the resistance of the body electrode 250 to dry etching. The gate electrode 280E protects the insulating film 230E located below the gate electrode 280E from damage by dry etching.

F. Sixth Embodiment

Figure 23:
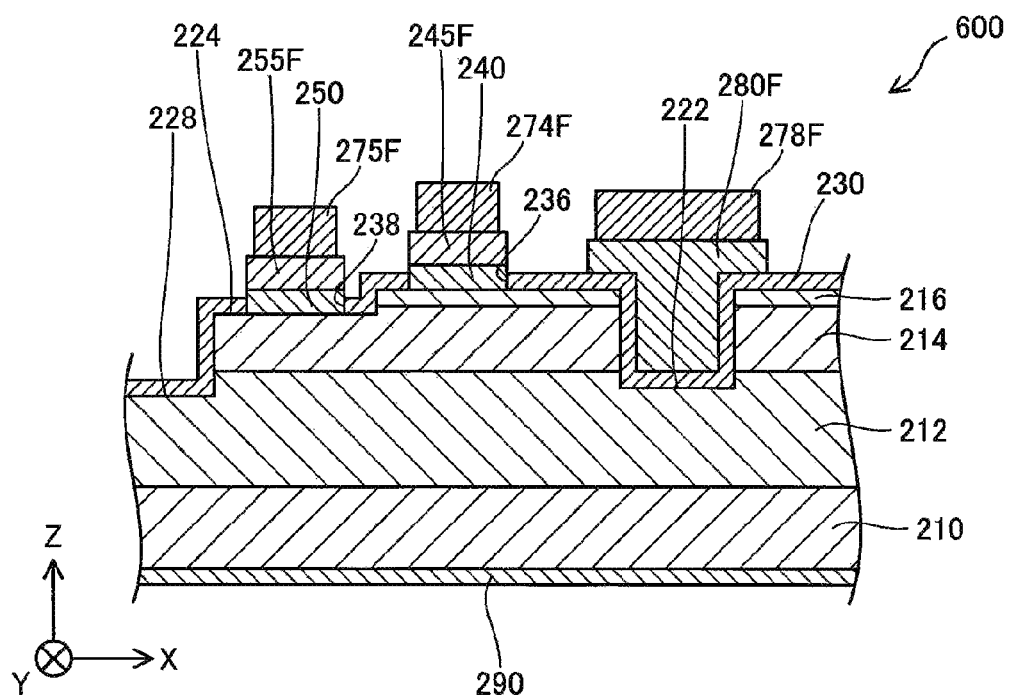
FIG. 23 is a sectional view schematically illustrating the configuration of a semiconductor device according to a sixth embodiment.

FIG. 23 is a sectional view schematically illustrating the configuration of a semiconductor device 600 according to a sixth embodiment. The configuration of the semiconductor device 600 is similar to the configuration of the semiconductor device 200 of the second embodiment, except that a molybdenum layer 245F is provided on the source electrode 240, that a molybdenum layer 255F is provided on the body electrode 250, that a gate electrode 280F is provided in place of the gate electrode 280, and that wiring electrodes 274F, 275F and 278F are provided.

The molybdenum layer 245F of the semiconductor device 600 is similar to the molybdenum layer 245 of the second embodiment, except that the molybdenum layer 245F is formed simultaneously with the gate electrode 280F. The molybdenum layer 255F of the semiconductor device 600 is similar to the molybdenum layer 255 of the second embodiment, except that the molybdenum layer 255F is formed simultaneously with the gate electrode 280F. The gate electrode 280F of the semiconductor device 600 is similar to the gate electrode 280 of the second embodiment, except that the gate electrode 280F is mainly made of molybdenum (Mo).

The wiring electrode 274F of the semiconductor device 600 is an electrode that is made of a conductive material and is formed on the molybdenum layer 245F. The wiring electrode 275F of the semiconductor device 600 is an electrode that is made of a conductive material and is formed on the molybdenum layer 255F. The wiring electrode 278F of the semiconductor device 600 is an electrode that is made of a conductive material and is formed on the gate electrode 280F. According to this embodiment, the wiring electrodes 274F, 275F and 278F are mainly made of aluminum (Al).

Figure 24:
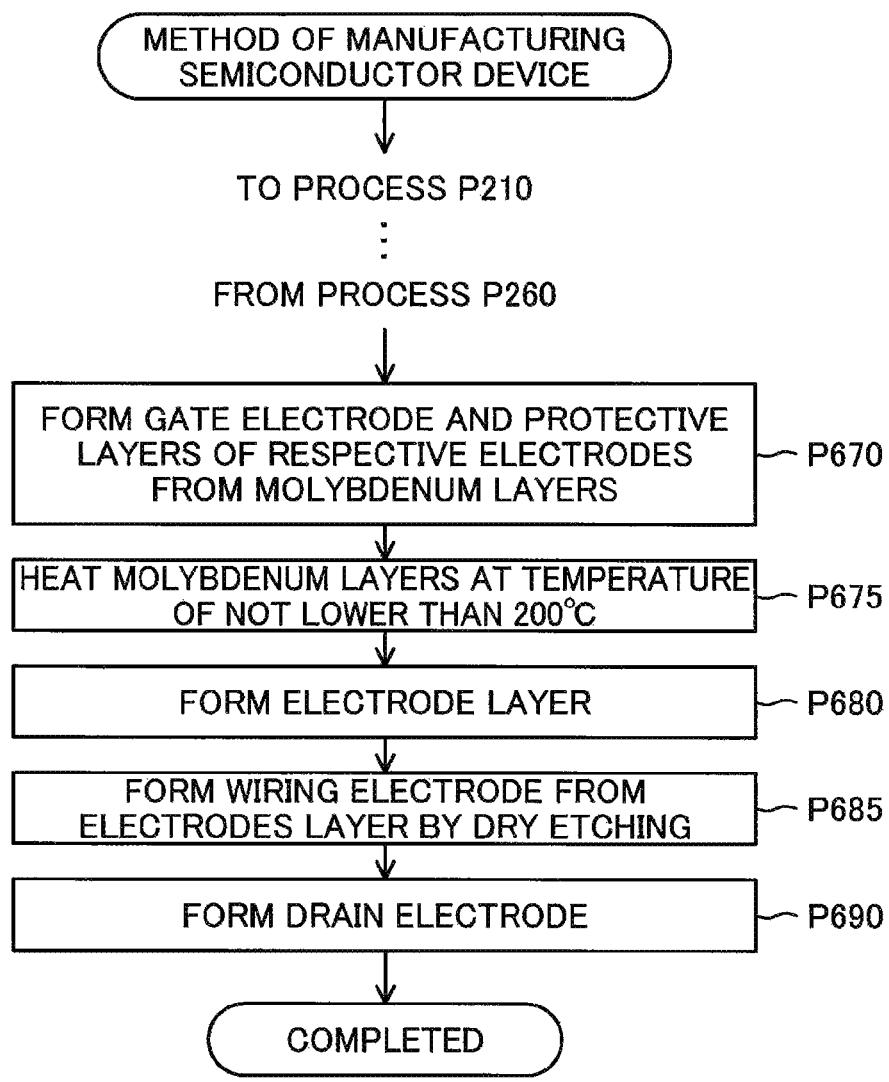
FIG. 24 is a process chart showing a method of manufacturing the semiconductor device according to the sixth embodiment.
Figure 25:
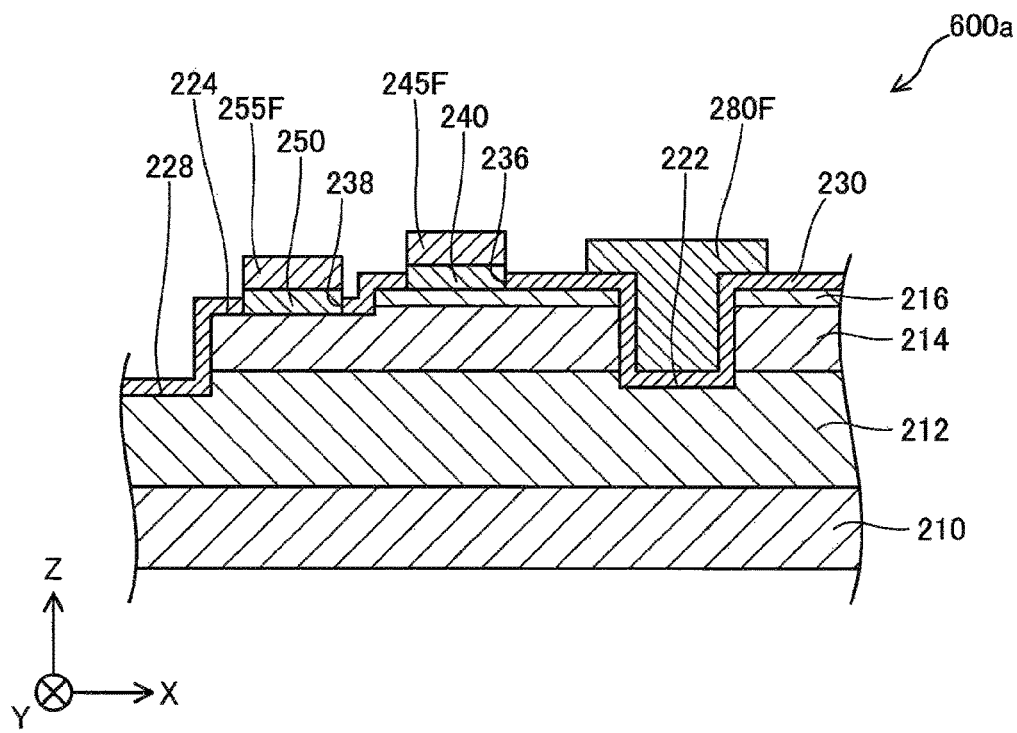
FIG. 25 is a diagram illustrating a process of manufacturing the semiconductor device.
Figure 26:
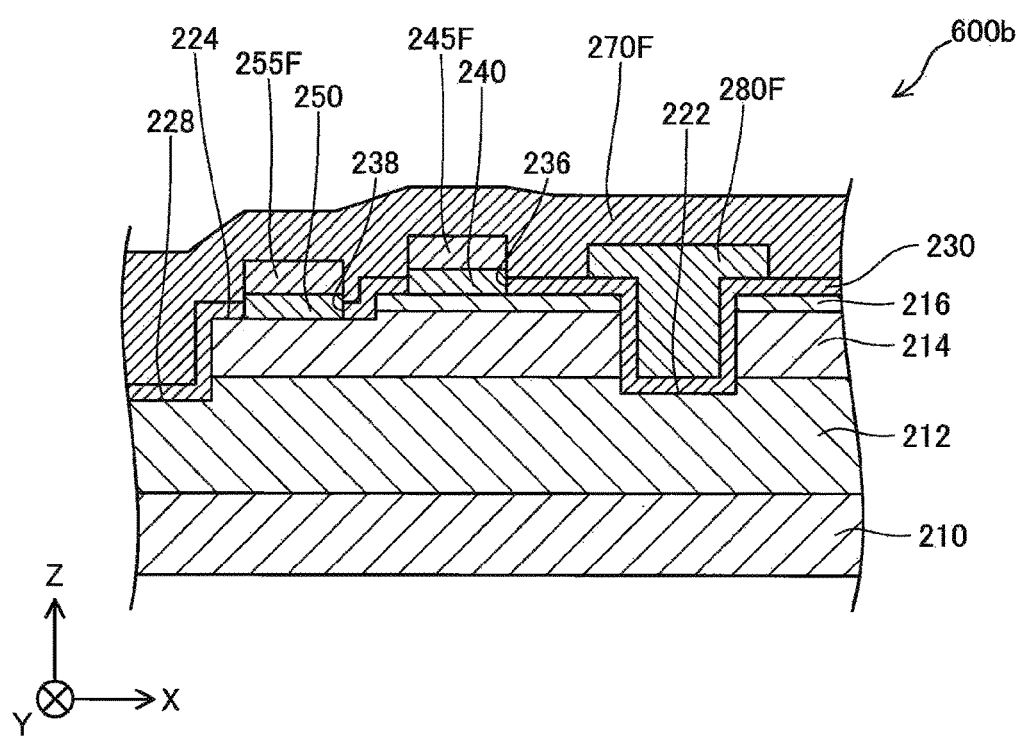
FIG. 26 is a diagram illustrating a process of manufacturing the semiconductor device.

FIG. 24 is a process chart showing a method of manufacturing the semiconductor device 600 according to the sixth embodiment. FIGS. 25 and 26 are diagrams illustrating the processes of manufacturing the semiconductor device 600.

After processing the source electrode 240 and the body electrode 250 by heat treatment like the second embodiment (process P260, FIG. 11), the manufacturer of the semiconductor device 600 forms the molybdenum layers 245F and 255F and the gate electrode 280F (process P670, FIG. 25). The manufacturer accordingly obtains a semiconductor device 600a including the molybdenum layers 245F and 255F and the gate electrode 280F as an intermediate product of the semiconductor device 600. According to this embodiment, the manufacturer forms the molybdenum layers 245F and 255F and the gate electrode 280F by electron beam deposition using the lift-off method, like the second embodiment.

After forming the molybdenum layers 245F and 255F and the gate electrode 280F (process P670), the manufacturer heats the molybdenum layers 245F and 255F and the gate electrode 280F at temperature of not lower than 200° C. (process P675), like the second embodiment.

After heating the molybdenum layers 245F and 255F and the gate electrode 280F (process P675), the manufacturer forms an electrode layer 270F as the base of the wiring electrodes 274F, 275F and 278F (process P680, FIG. 26). The manufacturer accordingly obtains a semiconductor device 600b including the electrode layer 270F as an intermediate product of the semiconductor device 600. According to this embodiment, the manufacturer forms the electrode layer 270F over the entire +Z-axis direction side surface of the semiconductor device 600a.

After forming the electrode layer 270F (process P680), the manufacturer removes part of the electrode layer 270F by dry etching to form the wiring electrodes 274F, 275F and 278F (process P685). According to this embodiment, the manufacturer forms a mask pattern (photoresist) in areas that are to be left as the wiring electrodes 274F, 275F and 278F and removes part of the electrode layer 270F by chlorine (Cl)-based dry etching to form the wiring electrodes 274F, 275F and 278F. The manufacturer then removes the mask pattern left on the wiring electrodes 274F, 275F and 278F.

After forming the wiring electrodes 274F, 275F and 278F (process P685), the manufacturer forms the drain electrode 290 (process P690), like the second embodiment. The semiconductor device 600 is completed by the above series of processes.

According to the sixth embodiment described above, like the second embodiment, the molybdenum layers 245F and 255F and the gate electrode 280F are heated at temperature of not lower than 200° C. This readily provides the molybdenum layers 245F and 255F and the gate electrode 280F as the metal layers having sufficient resistance to dry etching. This results in reducing the manufacturing cost of the semiconductor device 600.

The molybdenum layers 245F and 255F protect the source electrode 240 and the body electrode 250 respectively located below the molybdenum layers 245F and 255F from damage by dry etching. When the molybdenum layer 245F is regarded as part of the source electrode 240, the molybdenum layer 245F enhances the resistance of the source electrode 240 to dry etching. When the molybdenum layer 255F is regarded as part of the body electrode 250, the molybdenum layer 255F enhances the resistance of the body electrode 250 to dry etching.

G. Other Embodiments

The invention is not limited to any of the embodiments, the examples and the modifications described above but may be implemented by a diversity of other configurations without departing from the scope of the invention. For example, the technical features of any of the embodiments, the examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The semiconductor device which the present invention is applied to is not limited to the vertical trench MOSFET described in the above embodiments but may be, for example, a lateral MOS transistor, a junction transistor, a bipolar transistor, an insulated gate bipolar transistor (IGBT) or a thyristor.

In the embodiments described above, the material of the substrate is not limited to gallium nitride (GaN) but may be any of silicon (Si), sapphire ($Al_2O_3$) and silicon carbide (SiC).

In the embodiments described above, the material of each semiconductor layer is not limited to gallium nitride (GaN) but may be any of group III nitrides (for example, aluminum nitride (AlN) and indium nitride (InN)).

In the embodiments described above, the donor element contained in the n-type semiconductor layer is not limited to silicon (Si) but may be germanium (Ge) or oxygen (O).

In the embodiments described above, the acceptor element contained in the p-type semiconductor layer is not limited to magnesium (Mg) but may be zinc (Zn) or carbon (C).

In the embodiments described above, the material of the insulating film 130 may be any material having electrical insulating properties, for example, at least one of silicon dioxide ($SiO_2$), silicon nitrides (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON). The insulating film 130 may have a single-layered structure or may have a two-layered or multi-layered structure. The technique employed to form the insulating film 130 is not limited to ALD but may be another technique such as ECR sputtering or plasma CVD.

In the embodiments described above, the materials of the respective electrodes are not limited to those described in the above embodiments but may be any other suitable materials.

The invention claimed is:

1. A method of manufacturing a semiconductor device, the method comprising:
    forming a molybdenum layer that mainly comprises molybdenum (Mo), on at least one of a semiconductor layer, an insulating film, and an electrode in the semiconductor device;
    a heat treatment including heating the molybdenum layer at a temperature of not lower than 200° C.; and
    a dry etching of the semiconductor device that includes the molybdenum layer, subsequent to the heat treatment,
    wherein the dry etching processes the semiconductor device that includes at least one of the semiconductor layer and the insulating film exposed, and the exposed molybdenum layer by dry etching, with the molybdenum layer as a mask, subsequent to the heat treatment, and
    wherein, after the dry etching, a part of the molybdenum layer remains, and another part of the molybdenum layer is formed as a part of the electrode.

2. The method of manufacturing the semiconductor device according to claim 1, wherein the heat treatment heats the molybdenum layer that is placed in an atmosphere mainly comprising at least one of nitrogen, argon, and oxygen, or is placed in vacuum at temperature of not lower than 200° C.

3. The method of manufacturing the semiconductor device according to claim 1, wherein the heat treatment heats the molybdenum layer at a temperature of not lower than 200° C. for a time period between 1 minute and 10 minutes, inclusive.

4. The method of manufacturing the semiconductor device according to claim 1, wherein the dry etching processes the semiconductor device that includes the molybdenum layer that is exposed by the dry etching using a chlorine-containing gas, subsequent to the heat treatment.

5. The method of manufacturing the semiconductor device according to claim 1, further comprising:
    heating the electrode, prior to the forming the molybdenum layer.

6. The method of manufacturing the semiconductor device according to claim 1, wherein the forming the molybdenum layer forms the molybdenum layer on the electrode, and
    wherein the heat treatment heats the molybdenum layer at a temperature between 200° C. and 450° C., inclusive.

7. The method of manufacturing the semiconductor device according to claim 1, wherein the heat treatment heats the molybdenum layer at a temperature of not lower than 700° C.

8. The method of manufacturing the semiconductor device according to claim 1, further comprising:
    forming the semiconductor layer that mainly comprises gallium nitride (GaN).

9. A semiconductor device manufactured by the method of manufacturing the semiconductor device according to claim 1.

10. A method of manufacturing a semiconductor device, the method comprising:
    forming a molybdenum layer that mainly comprises molybdenum (Mo), on at least one of a semiconductor layer, an insulating film, and an electrode in the semiconductor device;
    a heat treatment including heating the molybdenum layer at temperature of not lower than 200° C.;
    forming an electrode layer so as to cover the molybdenum layer, subsequent to the heat treatment; and
    a dry etching of the semiconductor device that includes the molybdenum layer, subsequent to the heat treatment,
    wherein the dry etching performs dry etching of the semiconductor device with the molybdenum layer as a mask, and forms another electrode from the electrode layer, and
    wherein, after the dry etching, a part of the molybdenum layer remains, and the electrode comprising another part of the molybdenum layer and the another electrode are formed.

* * * * *